United States Patent [19]

Iwata et al.

[11] Patent Number: 5,638,013
[45] Date of Patent: Jun. 10, 1997

[54] CHARGE REDISTRIBUTION CIRCUIT AND METHOD

[75] Inventors: Toru Iwata; Hiroyuki Yamauchi, both of Osaka, Japan

[73] Assignee: Matsushita Electric Industrial Co., Ltd., Osaka, Japan

[21] Appl. No.: 458,654

[22] Filed: Jun. 2, 1995

[30] Foreign Application Priority Data

Jun. 3, 1994 [JP] Japan .................... 6-122533

[51] Int. Cl.$^6$ ........................................ H03K 4/02
[52] U.S. Cl. ............................ 327/126; 327/530
[58] Field of Search ........................ 327/126, 127, 327/128, 473, 530, 534, 536

[56] References Cited

FOREIGN PATENT DOCUMENTS 0 403 823  12/1990  European Pat. Off. .

OTHER PUBLICATIONS

Patent Abstracts of Japan, vol. 16, No. 182 (P–1346) Apr. 30, 1992 & JP-A- 40 021 112 (abstract).

*Primary Examiner*—Timothy P. Callahan
*Assistant Examiner*—Jeffrey Zweizig
*Attorney, Agent, or Firm*—McDermott, Will & Emery

[57] ABSTRACT

In a signal transmission circuit having a plurality of signal lines for supplying potentials to load capacitances, in which each load capacitance is driven by each signal line, each signal line can be connected to another signal line via a switch. By connecting two signal lines at different potentials to each other by means of said switch, the potentials of the signal lines are changed through the process of charge redistribution, thereby eliminating charging and discharging through a power-source line and a ground line. Therefore, if n load capacitances are equal to each other, the switches are controlled so that the potential variation of each of the signal lines is phase shifted from those of its adjacent signal lines by 1/n. Thus, the load capacitances can be driven with 1/n of the total amount of charge consumed in the case of driving the n load capacitances independently, thereby reducing the consumed current.

40 Claims, 15 Drawing Sheets

CHARGE REDISTRIBUTION CIRCUIT AND METHOD

BACKGROUND OF THE INVENTION

The present invention relates to an improved signal transmission circuit in a semiconductor integrated circuit such as a dynamic random-access memory (DRAM). More particularly, it relates to a lower-power circuit for driving a load in synchronization with an oscillation signal.

In general, a semiconductor integrated circuit such as a DRAM has an on-chip power-source circuit for simplifying the power-source structure of a circuit in which it is used. In the case of increasing an internal power-source voltage so that it becomes higher than an external power-source potential or in the case of reducing the internal power-source voltage so that it becomes lower than the ground potential, in particular, a charge pump circuit consisting of a capacitor, a rectifying circuit, and the like is used as a power-source circuit.

Below, the structure of a semiconductor integrated circuit in which the charge pump circuit is used as an increased-voltage power-source generating circuit is shown in FIG. 15(a). The charge pump circuit 70 consists of: a pump capacitor 71(Cp); a precharging means 72; and a rectifying means 78. One electrode of the pump capacitor 71(Cp) is connected at the node B to the precharging means 72 and to the rectifying means The above precharging means 72 has the function of precharging the node B to a specified potential if the potential of the node B is reduced. The above rectifying means 73 has the function of generating an increased-voltage power source by supplying charges from the node B to the output node of the charge pump circuit 70 only when the potential of the node B becomes higher than the potential of the output node, while preventing a reverse current from the output node of the charge pump circuit to the node B when the potential of the node B becomes lower than the potential of the output node.

In the above charge pump circuit 70, if a signal having a specified amplitude is inputted to the node A and the input signal shifts from the low level to the high level, the potential of the node B is increased due to the coupling of the pump capacitor 71(Cp), so that the potential of the output node is increased via the rectifying means 73. Thereafter, if the input signal shifts from the high level to the low level, the potential of the node B tends to become lower due to the coupling of the capacitor 71(Cp) but is clamped at a specified potential by the precharging means 72. The charges supplied from the precharging means to the node B is outputted via the rectifying means 73 when the input signal subsequently shifts from the low level to the high level.

However, in a conventional charge pump circuit, as described above, the following process is repeatedly performed: supplying charges in each cycle so that a specified operation is performed; and releasing the supplied charges in preparation for the next cycle. Consequently, the amount of charge consumed by the charge pump circuit is disadvantageously increased.

By way of example, a specific description will be given below to the operation of the above conventional charge pump circuit of FIG. 15(a), which consumes an increased amount of charge disadvantageously.

Since the charge pump circuit 70 only charges or discharges a pump capacitor Cp from the viewpoint of the node A, the charge pump circuit becomes equivalent to a capacitor of the capacitance C, as shown in FIG. 15(b). A detailed description will be given to the above process with reference to FIG. 10. In the drawings are shown: the charge pump circuit; a time chart for the nodes A and B; the potential difference between the nodes A and B; and the amount of charge accumulated in the pump capacitor Cp. Each of the precharging means and rectifying means of the charge pump circuit is composed of a diode. The power-source voltage for the precharging means is Vcc, which is equal to the power-source voltage for driving the node A. It is assumed that there is no loss in charge caused by the diodes. It is also assumed that, since a charge-pump circuit generally charges an increased-voltage power source having a sufficiently large capacitance, a single operation of the charge pump circuit hardly changes the potential of the output node and the output node of the charge pump circuit is clamped at the potential Vcc+Vp by a constant-voltage power source.

As shown in the time chart of the drawings, a rectangular pulse of the amplitude Vcc is inputted to the node A so as to drive the charge pump circuit, while the potential of the node B varies in synchronization with the potential of the node A. Since the minimum potential of the node B is fixed at Vcc by the precharging means, while the maximum potential of the node B is fixed at Vcc+Vp by the rectifying means and constant-voltage power source, the potential difference between the nodes A and B becomes Vcc and Vp when the node A is at 0 V and Vcc, respectively, as noted in the time chart. The charge appearing at the plate on the side of the node A of the pump capacitor Cp amounts to −Cp·Vcc and −Cp·Vp when the node A is at 0 V and Vcc, respectively. On the other hand, the charge appearing at the plate on the side of the node B of the pump capacitor CD amounts to Cp·Vcc and Cp·Vp when the node A is at 0 V and Vcc, respectively. As a result, when the potential of the node A shifts from 0 V to Vcc, the charge of Cp·(Vcc−Vp) is accumulated in the plate on the side of the node A of the pump capacitor, while the charge of Cp·(Vcc−Vp) is released as an output current from the plate on the side of the node B of the pump capacitor via the rectifying diode. When the potential of the node A shifts from Vcc to 0 V, the charge of Cp·(Vcc−Vp) is released from the plate on the side of the node A of the pump capacitor, while the charge of Cp·(Vcc−Vp) from the power source is accumulated in the plate on the side of the node B of the pump capacitor by the precharging diode.

The total amount of charge supplied from the power source to the charge pump circuit is the sum of Cp·(Vcc−Vp) supplied via the precharging diode and Cp·(Vcc−Vp) supplied to the node A, while the total amount of charge outputted is Cp·(Vcc−Vp), so that the charge pump circuit consumes the amount of charge which is double the amount of charge outputted.

Since the precharging means and rectifying means in the charge pump circuit causes a loss in charge in practice, the efficiency of the charge pump circuit is as low as 50% or less. Moreover, in the case of driving the charge pump circuit with a pulse of the amplitude Vcc, the charge of Cp·(Vcc−Vp) is consumed in each cycle from the viewpoint of the node A, so that the charge pump circuit becomes equal to a capacitor of the capacitance Cp·(Vcc−Vp)/Vcc.

SUMMARY OF THE INVENTION

An object of the present invention is to reduce the current consumed by a signal transmission circuit for driving a load capacitance such as the above charge pump circuit.

To attain the above object, if a specified load capacitance is driven according to the present invention, a signal line for driving the load capacitance as well as a capacitor is divided into a plurality of parts. The individual parts of the capacitor are disposed to correspond to the individual parts of the signal line, as shown in the conceptual view of FIG. 16, so that the individual parts of the capacitor are driven with phases different from each other. When the charges supplied to one part of the capacitor are released, the released charges are reused as the charges to be supplied to another part of the capacitor, thereby reducing the current consumed by the signal transmission circuit.

That is, the present invention provides a signal transmission method in which a plurality of signals are transmitted along their corresponding signal lines, wherein if said plurality of signal lines include a signal line in potential increasing process and a signal line in potential decreasing process, the charges of the signal line in potential decreasing process are redistributed to said signal line in potential increasing process.

The present invention also provides a signal transmission circuit comprising: a plurality of signal lines; a connecting means for connecting said plurality of signal lines to each other; and a control means for connecting, by means of said connecting means, a signal line in potential increasing process of said plurality of signal lines to a signal line in potential decreasing process of said plurality of signal lines so that the charges of the signal line in potential decreasing process are redistributed to the signal line in potential increasing process.

The present invention also provides a semiconductor integrated circuit comprising a signal transmission circuit and operating circuits each for performing a specified operation in response to a signal transmitted from said signal transmission circuit, wherein said signal transmission circuit comprises: a plurality of signal lines; a connecting means for connecting said plurality of signal lines to each other; and a control means for connecting, by means of said connecting means, a signal line in potential increasing process of said plurality of signal lines to a signal line in potential decreasing process of said plurality of signal lines so that the charges of the signal line in potential decreasing process are redistributed to the signal line in potential increasing process.

In addition, the present invention provides a semiconductor integrated circuit, wherein the operating circuits are a plurality of charge pump circuits and the plurality of signals transmitted from the signal transmission circuit are drive signals to be supplied to the corresponding charge pump circuits.

With the above structures, if the potentials of the plurality of signal lines are varied with respective specified amplitudes which are different from each other in the signal transmission method and signal transmission circuit of the present invention, the connecting means is controlled by the control means so as to connect a signal line in potential increasing process and a signal line in potential decreasing process having a potential higher than that of the signal line in potential increasing process, the charges possessed by the connected signal lines are redistributed therebetween. Consequently, the potential of the signal line in potential increasing process is increased with no charging and discharging via the power source, while the potential of the signal line in potential decreasing process is decreased simultaneously.

If the foregoing operation is repeatedly performed for different pairs of signal lines, the consumed current is reduced due to the charge redistribution, while the potentials of the plurality of signal lines vary with the same frequency, though their phases are different from each other, so that the load capacitance is driven by consuming lower power.

Furthermore, the present invention can provide a low-power large-scale semiconductor integrated circuit which is operated with a low-power charge pump using the above signal transmission circuit and with a clock generating circuit composed of the above signal transmission circuit.

The above objects and novel features of the present invention will be more apparent from the reading of the following description in conjunction with the accompanying drawings.

BRIEF DESCRIPTION OF THE DRAWINGS

The accompanying drawings illustrate the preferred embodiments of the present invention.

In the drawings.

DETAILED DESCRIPTION OF THE PREFERRED EMBODIMENTS

Below, the preferred embodiments of the present invention will be described with reference to the accompanying drawings.

First Embodiment

Figure 1:
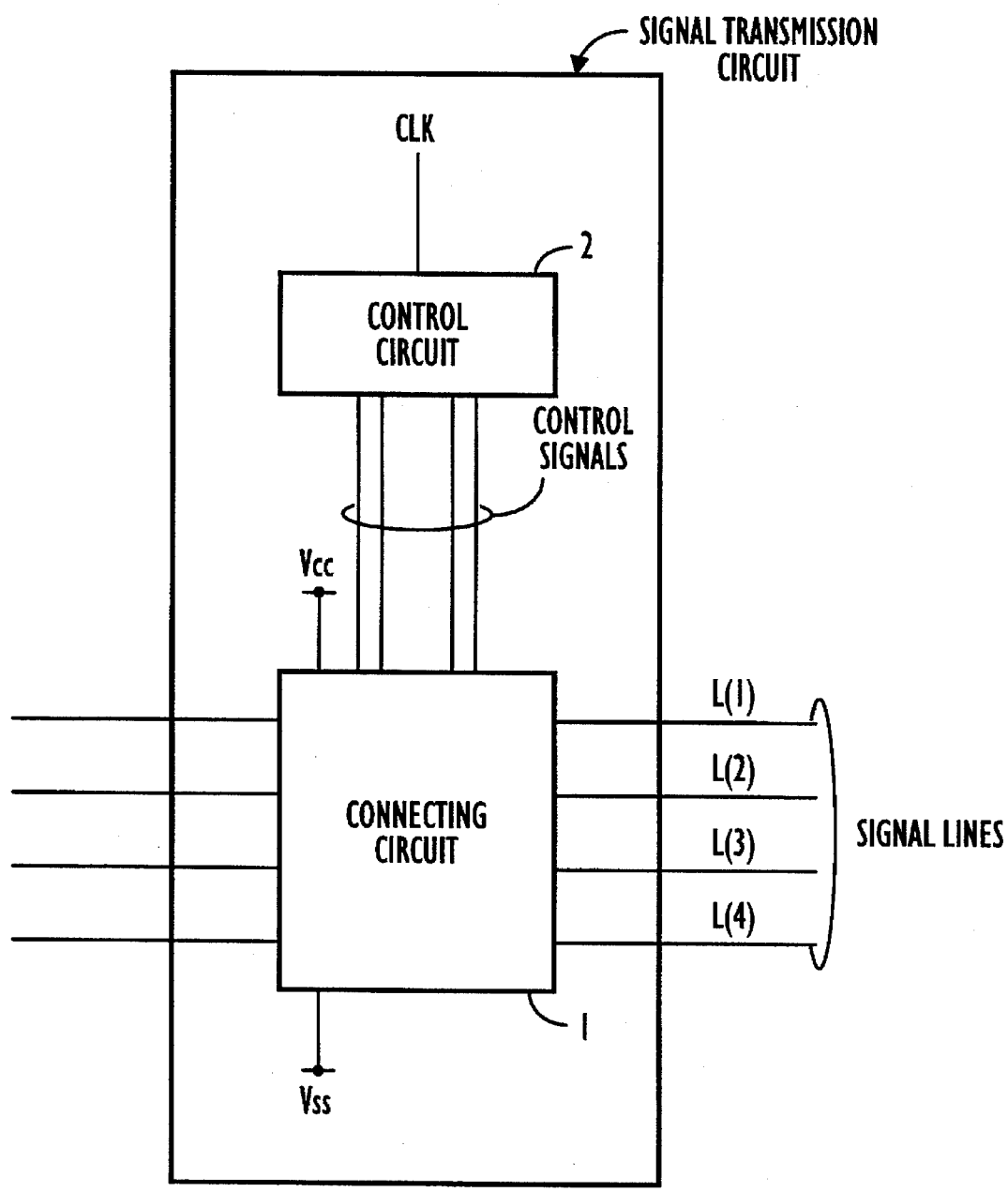
FIG. 1 schematically shows the overall structure of a first embodiment.

FIG. 1 shows the overall structure of a signal transmission circuit in a first embodiment of the present invention.

In the drawing are shown: a plurality of (four) signal lines L(1), L(2), L(3), and L(4); a power-source line (first potential accumulating means) Vcc; a ground line as another power-source line (second potential accumulating means) Vss; a connecting circuit (connecting means) 1 for connecting the signal lines L(1), L(2), L(3), and L(4) to each other and connecting the signal lines L(1), L(2), L(3), and L(4) to the power-source line Vcc or to the ground line Vss; a control circuit (control means) 2 for receiving a clock signal CLK and outputting, based on the clock signal CLK, a control signal for controlling the above connecting circuit 1.

Figure 2:
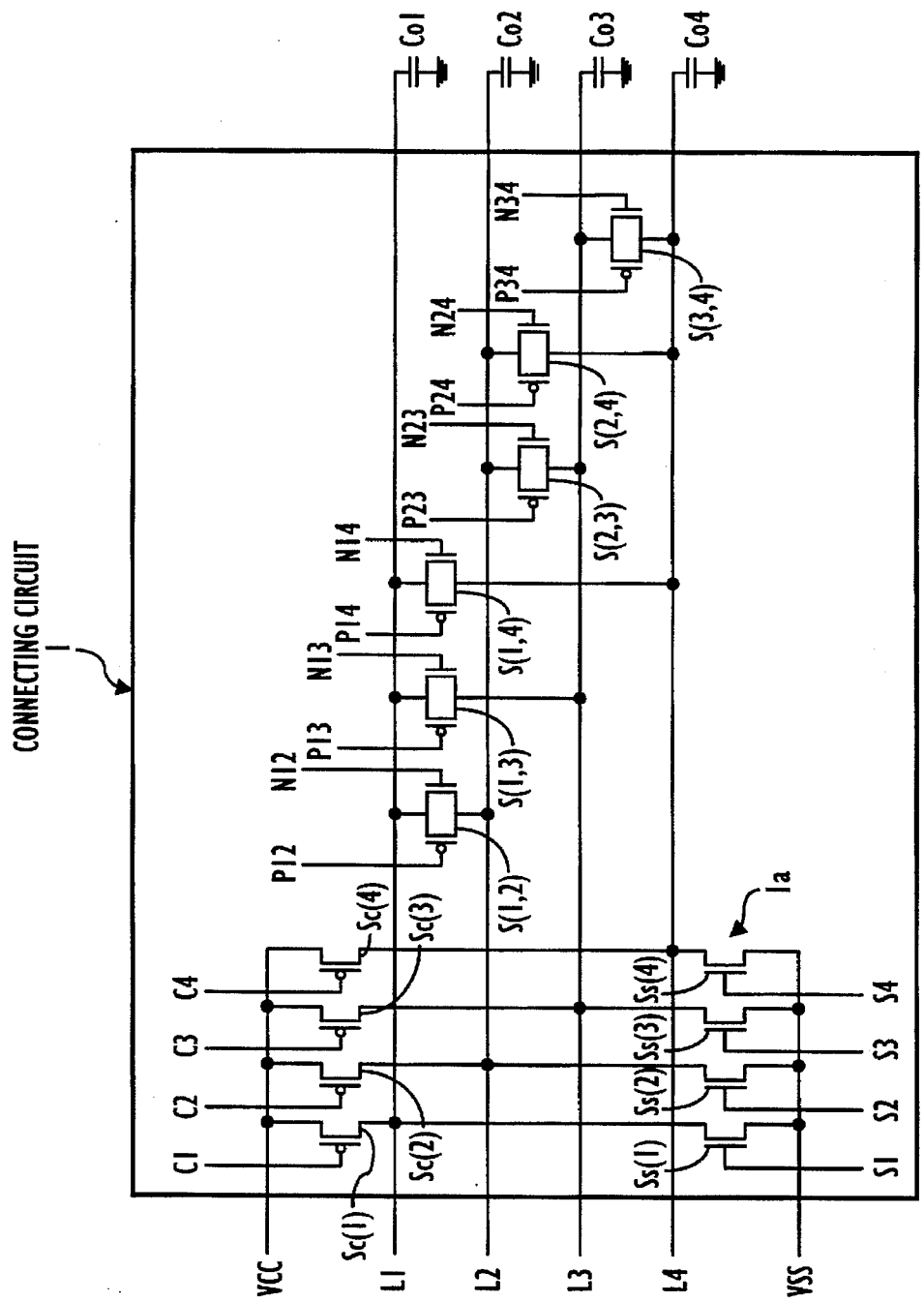
FIG. 2 shows the internal structure of a connecting circuit in a signal transmission circuit of the first embodiment.

FIG. 2 shows in detail the above connecting circuit. In the drawing are shown: switches Sc(1), Sc(2), Sc(3), and Sc(4) for connecting the above respective signal lines L(1), L(2), L(3), and L(4) to the power-source line Vcc; switches Ss(1), Ss(2), Ss(3), and Ss(4) for connecting the respective signal lines L(1) . . . , L(n) to the ground line Vss; and switches S(1,2), S(1,3), S(1,4), S(2,3), S(2,4), and S(3,4) for connecting the above four signal lines L(1) to L(4) to each other.

Control signals C1, C2, C3, and C4 control the switches Sc(1) to Sc(4), respectively. Control signals S1, S2, S3, and S4 control the switches Ss(1) to Ss(4), respectively. Control signals P12 and N12 control the switch S(1,2). Similarly, control signals P13 and N13 control the switch S(1,3), control signals P14 and N14 control the switch S(1,4), control signals P23 and N23 control the switch S(2,3), control signals P24 and N24 control the switch S(2,4), and control signals P34 and N34 control the switch S(3,4). There are also shown capacitances Co(1), Co(2), Co(3), and Co(4) driven by the above signal lines L(1) to L(4), respectively. The variables inside the parentheses for identifying the switches and capacitances correspond to the numbers inside the parentheses for identifying the signal lines L(1) to L(4). The above switches Sc(1) to Sc(4) and Ss(1) to Ss(4) constitute a power-source connecting means 1a.

Figure 3:
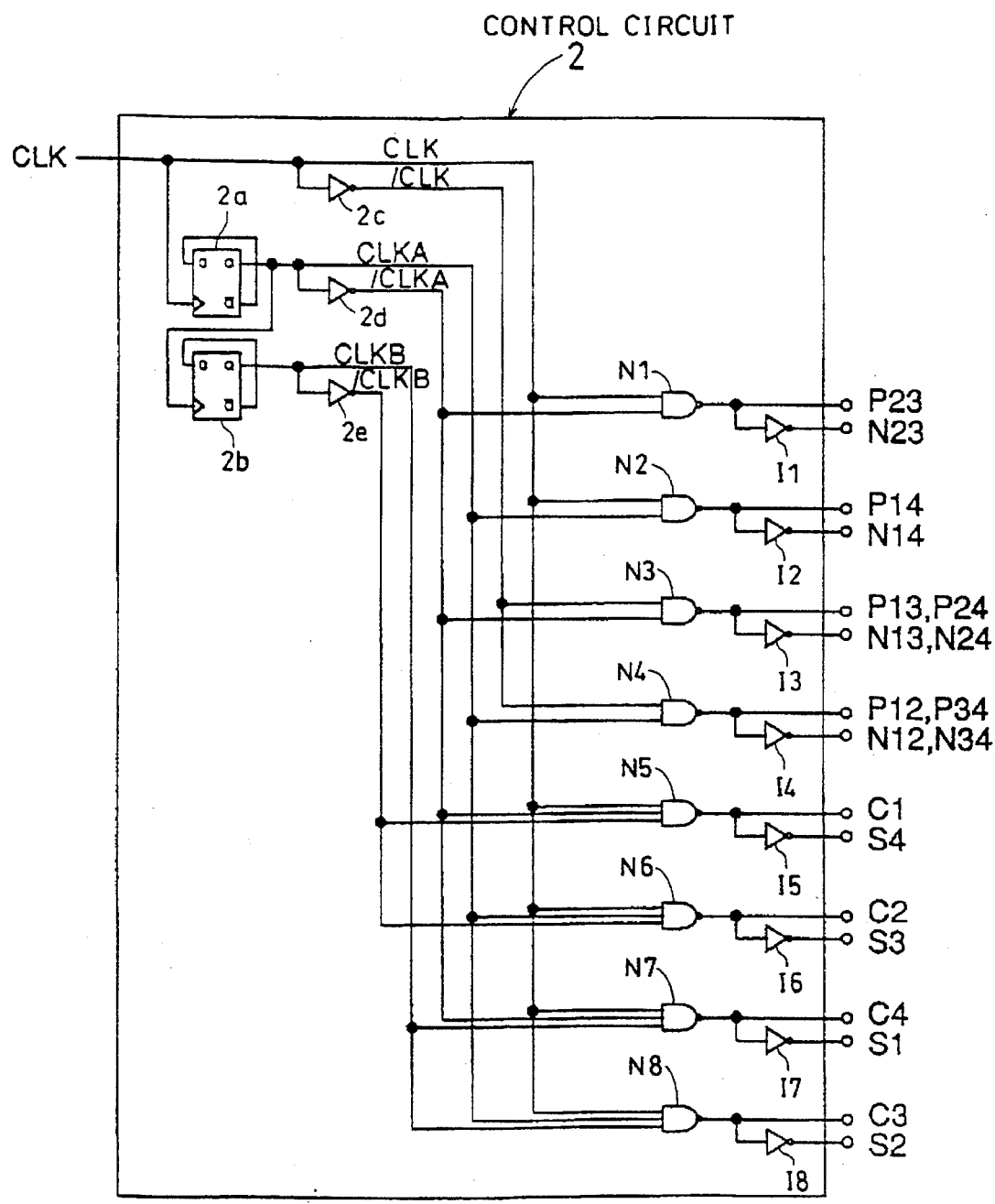
FIG. 3 is a view showing the internal structure of a control circuit in the signal transmission circuit of the first embodiment.
Figure 4:
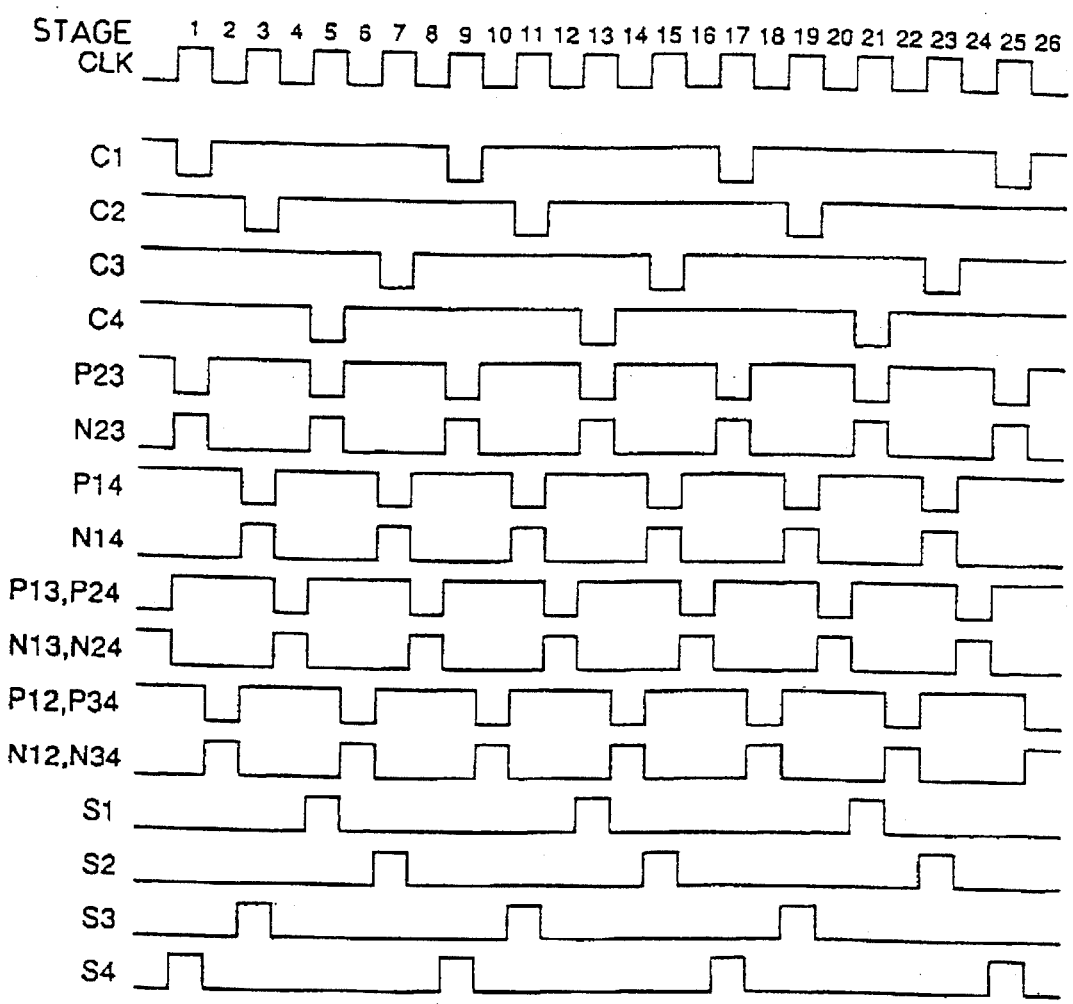
FIG. 4 is a view showing the respective waveforms of control signals generated from the control circuit in the signal transmission circuit of the first embodiment.
Figure 5:
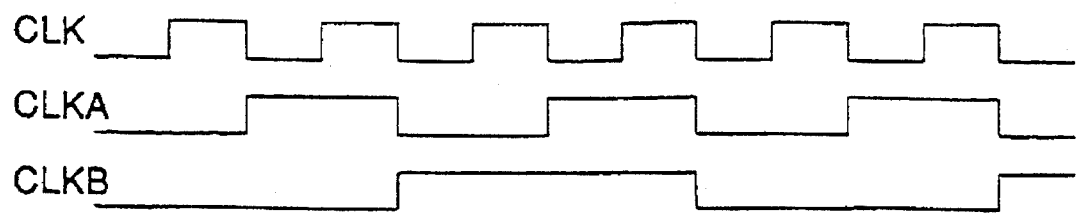
FIG. 5 is a view showing the respective waveforms of three types of clock signals in the signal transmission circuit of the first embodiment.

FIG. 3 shows the internal structure of the above control circuit 2, which generates the above control signals C1 to C4, S1 to S4, P12 and N12 to P34 and N34 so that they vary as shown in FIG. 4. Specifically, the control circuit 2 consists of: two flip-flops 2a and 2b; three inverters 2c to 2e; eight NAND circuits N1 to N8; and eight inverters I1 to I8. As shown in FIG. 5, the above flip-flop 2a generates a signal CLKA obtained by halving the frequency of the clock signal CLK, while the flip-flop 2b generates a signal CLBK obtained by further halving the above signal CLKA, i.e., quartering the original clock signal CLK. The inverter 2c generates a signal/CLK by inverting the clock signal CLK. The inverter 2d generates a signal/CLKA by inverting the half-frequency signal CLKA. The inverter 2e generates a signal/CLKB by inverting the quarter-frequency signal CLKB. Each of the NAND circuits N1 to N8 receives specified two or three of the above signals so that they generate the control signals P23, P14, P13, P24, P12, P34, C1, C2, C3, and C4, respectively. The eight inverters I1 to I8 invert the outputs from the corresponding NAND circuits N1 to N8, so as to generate the control signals N23, N14, N13, N24, N12, N34, S4, S3, S2 and S1.

Next, a description will be given to the operation in which the above control circuit 2 controls the switches Sc(1) to Sc(4), Ss(1) to Ss(4), and S(1,2) . . . S(3,4) with reference to FIG. 6.

Figure 6:
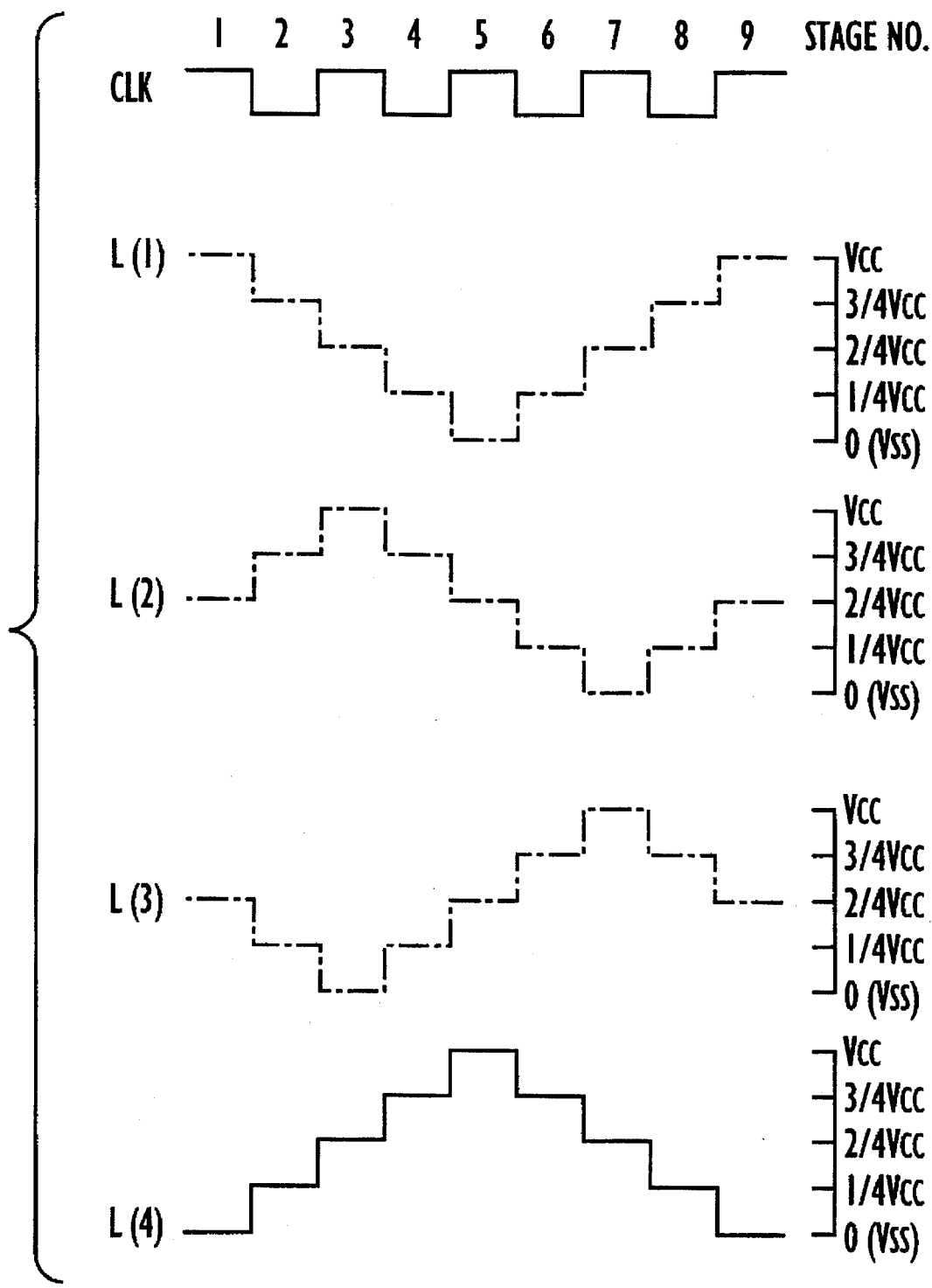
FIG. 6 is a view showing a time chart in the case where four signal lines are provided in the signal transmission circuit of the first embodiment.

Although the number of signal lines is generally represented by n, FIG. 6 shows the clock CLK and variations in the potentials of the respective signal lines L(1) to L(4) on the assumption that n=4 is satisfied for simplicity, similarly to FIG. 1. The clock CLK may be applied from outside the chip or generated on the chip. It is also assumed that the capacitances Co(1) to Co(4) are equal in value and that no loss is caused therein by the switches.

At a certain moment, the signal line L(1) is connected to the power source line Vcc by the switch Sc(1), while the signal line L(4) is connected to the ground line Vss by the switch Ss(4). The signal lines L(2) and L(3) are connected to each other by the switch S(2,3) so that the potentials thereof are at ½·Vcc. The state described above is designated as a stage 1.

If the clock CLK shifts to a different level and a stage 2 is reached, the switches Sc(1), Ss(4), and S(2,8) are turned off, thereby disconnecting the signal line L(1) from the power source line Vcc, the signal line L(4) from the ground line Vss, and the signal line L(2) from the signal line L(8). Subsequently, the switches S(1,2) and S(8,4) are turned on, thereby connecting the signal line L(1) to the signal line L(2) and the signal line L(8) to the signal line L(4). The capacitances C(1) to C(4) driven by the signal lines are equal and the capacitance C(1) has been charged to the potential of the power-source line Vcc, while the capacitance C(2) has been charged to ½·Vcc so that, if the signal lines L(1) and L(2) are connected to each other, charge redistribution occurs between the capacitances C(1) and C(2) and the potentials of the signal lines L(1) and L(2) become ¾·Vcc. Briefly, the charges discarded to reduce the potential of the signal line L(1) is utilized to increase the potential of the signal line L(2). Similarly, the capacitance C(4) has been charged to the potential 0 V of the ground line Vss, while the capacitance C(8) is charged to ½·Vcc so that, if the signal lines L(3) and L(4) are connected to each other, the potentials of the signal lines L(3) and L(4) become ¼·Vcc. At the stage 2, even when the potentials of the respective signal lines vary, no charge is supplied or released through the power-source line Vcc and the ground line Vss.

Next, if the clock CLK shifts to the other level and a stage 3 is reached, the switches S(1,2) and S(3,4) are turned off, thereby disconnecting the signal line L(1) from the signal line L(2) and the signal line L(3) from the signal line L(4). Subsequently, the switches Sc(2), Ss(3), and S(1,4) are turned on, thereby connecting the signal line L(2) to the power-source line Vcc, the signal line L(3) to the ground line Vss, and the signal line L(1) to the signal line L(4). As a result, the potential of the signal line L(2) becomes the potential of the power-source line Vcc, while the potential of the signal line L(3) becomes 0 V. Since the capacitances C(1) and C(4) have been charged to ¾·Vcc and ¼·Vcc, respectively, the potentials of the signal lines L(1) and L(4) become ½·Vcc. At the stage 3, the total amount of charge supplied or released through the power-source line Vcc and ground line Vss is the sum of ¼·Vcc×C supplied from the power-source line Vcc to the capacitance C(2) and ¼·Vcc×C released from the capacitance C(3) onto the ground line Vss. The above C represents the value of the capacitance driven by any one of the signal lines.

At the subsequent stages, the switches connected at the previous stage are similarly disconnected. Then, at a stage 4, the switches S(2,4) and S(1,3) are turned to ON to connect the signal lines L(2) and L(4) to each other and the signal lines L(1) and L(3) to each other. At a stage 5, the switches Sc(4), Ss(1), and S(2,3) are turned to ON to connect the signal line L(4) to the power-source line Vcc, to connect the signal line L(1) to the ground line Vss and to connect the signal lines L(2) to L(3) to each other. At a stage 6, the switches S(3,4) and S(1,2) are turned to ON to connect the signal lines L(3) and L(4) to each other and the signal lines L(1) and L(2) to each other. At a stage 7, the switches Sc(3), Ss(2), and S(1,4) are turned to ON to connect the signal line L(3) to the power-source line Vcc, to connect the signal line L(2) to the ground line Vss and to connect the signal lines L(1) to L(4) to each other. At a stage 8, the switches S(1,3) and S(2,4) are turned to ON to connect the signal lines L(1) and L(3) to each other and the signal lines L(2) and L(4) to each other. At a stage 9, the switches Sc(1), Ss(4), and S(2,3) are turned to ON to connect the signal line L(1) to the power-source line Vcc, connected to the signal line L(4) to the ground line Vss and to connect the signal lines L(2) to L(3) to each other. After that, the state at the stage 1 is reached again.

With the above switch control, the potentials of the signal lines L(1) to L(4) vary stepwise by ¼·Vcc in each ½ of the cycle of the clock CLK, so that four signals having the amplitude Vcc, each of which is phase shifted from its adjacent signals by ¼ of one cycle, are generated. Moreover, since the charge of ¼·Vcc×C is consumed at any odd-numbered stage, the total amount of charge consumed by the signal transmission circuit of FIG. 1 during four cycles of the clock CLK becomes Vcc×C. Since each of the capacitances C(1) to C(4) consumes the amount of charge Vcc×C during four cycles of the clock CLK, it follows that the whole signal transmission circuit drives the capacitances C(1) to C(4) by consuming ¼ of the amount of charge consumed if no charge is recycled.

Next, there will be shown the order in which the control means connects the switches Sc(1)...Sc(n), Ss(1)...Ss(n), and S(1,2)...S(n−1,n) on the assumption that the number of signal lines is generally represented by n.

The potential of a signal line when it is considered whether the potential is in increasing process or in decreasing process will be termed "state of signal line". As shown in FIG. 6, the states of the signal lines L(1), L(2), L(3), and L(4) at the stage 1 are reproduced at the stage 3 on the signal lines L(2), L(4), L(1), and L(3), respectively. Likewise, the states of the signal lines L(1), L(2), L(3), and L(4) at the stage 2 are reproduced at the stage 4 on the signal lines L(2), L(4), L(1), and L(3), respectively. The foregoing relations will be reconsidered in terms of signal-line identifying variables.

The signal-line identifying variables 1, 2, 3, and 4 at the stages 1 and 2 are converted to 2, 4, 1, and 3 at the stages 3 and 4, respectively. If the above relation is represented by a conversion f, f(1)=2, f(2)=4, f(3)=1, and f(4)=3, i.e., f(1,2,3,4)=(2,4,1,3) is satisfied.

A reconsideration will be given to further advanced stages. As shown in FIG. 6, since the phases of the signal lines L(1), L(2), L(4), and L(3) are delayed by two stages (¼ of one cycle) in this order, the state of the signal line L(1) at a certain stage is surely reproduced two stages ahead on the signal line L(2), the phase of which is delayed by two stages (¼ of one cycle) from that of the signal line L(1). Likewise, the states of the signal lines L(2), L(3), and L(4) at a certain stage are reproduced two stages ahead on the signal lines L(4), L(1), and L(3), respectively. If attention is focused on the signal-line identifying variables, the signal-line identifying variables 1, 2, 3, and 4 at a certain stage are converted to 2, 4, 1, and 3 two stages ahead, respectively. Consequently, the relation between a signal line in a certain state at a certain stage and the signal line on which the state will be reproduced two stages ahead can also be represented by the conversion f, with which the states of the respective signal lines can be obtained every two stages. In short, the states of the respective signal lines in each cycle of the clock CLK can be obtained.

For example, the states of the signal line L(1), L(2), L(3), and L(4) at the stage 1 are reproduced at the stage 5 on the signal lines L(4), L(3), L(2), and L(1), respectively. The states of the signal lines L(1), L(2), L(3), and L(4) at the stage 2 are reproduced at the stage 6 on the signal lines L(4), L(3), L(2), and L(1), respectively. The signal-line identifying variables 1, 2, 3, and 4 at the stages 1 and 2 have been converted to 4, 8, 2, and 1 at the stages 5 and 6, respectively. As described above, since f(1)=2, f(2)=4, f(3)=1, and f(4)=3 are satisfied and the relation between a signal line in a certain state at the stages 1 and 2 and the signal line on which the state will be reproduced at the stages 3 and 4 is f(1,2,3,4)=(2,4,1,3), the relation between a signal line in a certain state at the stages 1 and 2 and the signal line on which the state will be reproduced at the stages 5 and 6 becomes f(f(1,2,3,4))=f(2,4,1,3)=(4,3,2,1), so that the states on the respective signal lines in each cycle of the clock CLK can be obtained through the conversion f.

The relation between a switch connected at a certain time and the switch that will have been connected after one cycle of the clock CLK can be represented by the conversion f if the signal-line identifying variables are used. That is, since f(1,2,3,4)=(2,4,1,3) is satisfied, the switches Sc(2), Ss(3), and S(1,4) and the switches S(2,4) and S(1,3) are closed at the stages 3 and 4, respectively, instead of the switches Sc(1), Ss(4), and S(2,3) closed at the stage 1 and the switches S(1,2) and S(3,4) at the stage 2. Similarly, since f(f(1,2,3,4))=f(2,4,1,3)=(4,3,2,1) are satisfied, the switches Sc(4), Ss(1), and S(2,3) and the switches S(4,3) and S(1,2) are closed at the stages 5 and 6 after two cycles of the clock CLK, respectively. Moreover, since f(f(f(1,2,3,4)))=f(f(2,4,1,3))=f(4,3,2,1)=(3,1,4,2) are satisfied, the switches Sc(3), Ss(2), and S(1,4) and the switches S(1,3) and S(2,4) are closed at the stages 7 and 8 after three cycles of the clock CLK, respectively. Furthermore, since f(f(f(f(1,2,3,4))))=f(f(f(2,4,1,3)))=f(f(4,3,2,1))=f(3,1,4,2)=(1,2,3,4) are satisfied, the switches Sc(1), Ss(4), and S(2,3) and the switches S(1,2) and S(3,4) are closed at the stages 9 and 10 after four cycles of the clock CLK, respectively, thereby returning to the initial stage.

Table 1 shows the relations between the signal-line identifying variables for signal lines connected from a certain time on during the period of two stages and the signal-line identifying variables for signal lines connected during the period of two stages after one cycle of the clock CLK, i.e., the relations between the signal-line identifying variables in accordance with the conversion f in the cases where the number N of the signal lines is 2 to 10, respectively. The leftmost column X indicates the original signal-line identifying variables and the uppermost row indicates the number of signal lines.

TABLE 1

| N<br>X | 2 | 3 | 4 | 5 | 6 | 7 | 8 | 9 | 10 |
|---|---|---|---|---|---|---|---|---|---|
| 1 | 2 | 2 | 2 | 2 | 2 | 2 | 2 | 2 | 2 |
| 2 | 1 | 3 | 4 | 4 | 4 | 4 | 4 | 4 | 4 |
| 3 |   | 1 | 1 | 1 | 1 | 1 | 1 | 1 | 1 |
| 4 |   |   | 3 | 5 | 6 | 6 | 6 | 6 | 6 |
| 5 |   |   |   | 3 | 3 | 3 | 3 | 3 | 3 |
| 6 |   |   |   |   | 5 | 7 | 8 | 8 | 8 |
| 7 |   |   |   |   |   | 5 | 5 | 5 | 5 |
| 8 |   |   |   |   |   |   | 7 | 9 | 10 |
| 9 |   |   |   |   |   |   |   | 7 | 7 |
| 10 |   |   |   |   |   |   |   |   | 9 |

In the case where the number of signal lines is n=4, load capacitances can be driven by consuming ¼ of the amount of charge consumed by the load capacitances when no charge is recycled, as described above. If consideration will be given to the cases where the number of signal lines n≠4, the load capacitances can be driven analogously by consuming 1/n of the amount of charge consumed by the load capacitances if no charge is recycled, so that the increased-voltage power-source generation efficiency is increased as the number for division n is increased.

In the above connecting circuit 1 of FIG. 2, the switches (first power-source connecting means) Sc(1) to Sc(4) for connecting the corresponding signal lines to the power-source line Vcc are composed of PMOS transistors, while the switches (second power-source connecting means) Ss(1) to Ss(4) for connecting the corresponding signal lines to the ground line Vss are composed of NMOS transistors. On the other hand, the switches S(1,2) to Ss(3,4) for connecting the signal lines to each other are composed of CMOS transistors.

In general, in an NMOS transistor, a current is allowed to flow if the potential difference between the gate and source (the gate has a higher potential than the source) becomes a specified value or more (the potential difference is termed an NMOS transistor subthreshold voltage Vtn). In a PMOS transistor, on the other hand, a current is allowed to flow if the potential difference between the gate and source (the gate has a lower potential than the source) becomes a specified value or less (the potential is termed a PMOS transistor subthreshold voltage Vtp). Moreover, the on resistance of the NMOS transistor becomes lower as the voltage between the gate and source becomes higher than Vtn, while the on resistance of the PMOS transistor becomes lower as the voltage between the gate and source becomes lower than Vtp.

As described above, since the switches Sc(1) to Sc(4) are for connecting the corresponding signal lines to the power-source line Vcc so as to charge the signal lines to the high level, if NMOS transistors are to be used as the switches Sc(1) to Sc(4), the gate potentials of the NMOS transistors should be set higher than the potential of the power-source line Vcc by Vtn or more. To reduce the on resistances of the NMOS transistors, on the other hand, the potential between the gate and source should be increased by further increasing the gate potential. Hence, the NMOS transistors cannot compose efficient switches Sc(1) to Sc(4). However, if PMOS transistors are used instead as the switches Sc(1) to Sc(4), with their sources being connected to the power-source line Vcc and their drains being connected to the signal lines, and if the low-level voltage is applied to their gates so as to close the switches, the potential between the gate and source can be increased, thereby efficiently charging the signal lines to the high level.

Moreover, since the switches Ss(1) to Ss(4) are for connecting the corresponding signal lines to the ground line Vss so as to charge the signal lines to the low level, if NMOS transistors are used as the switches Ss(1) to Ss(4), with their sources being connected to the ground line Vss and their drains being connected to the signal lines, and if the high-level voltage is applied to their gates so as to close the switches, the potential between the gate and source can be increased, thereby efficiently charging the signal lines to the low level.

Furthermore, since the potentials of the signal lines connected by the switches S(1,2) to Ss(3,4) can have arbitrary values within the range of the potentials of the power-source line Vcc and ground line Vss, if CMOS transistors are used as the switches S(1,2) to Ss(3,4), efficient charge redistribution can be performed between the signal lines.

Second Embodiment

Next, a second embodiment of the present invention will be described with reference to FIG. 7.

Although it is assumed in the above first embodiment that the load capacitances C(1) to C(4) to be driven are equal in value, it is assumed in the present embodiment that the load capacitances C(1) to C(4) to be driven are not equal in value.

Figure 7:
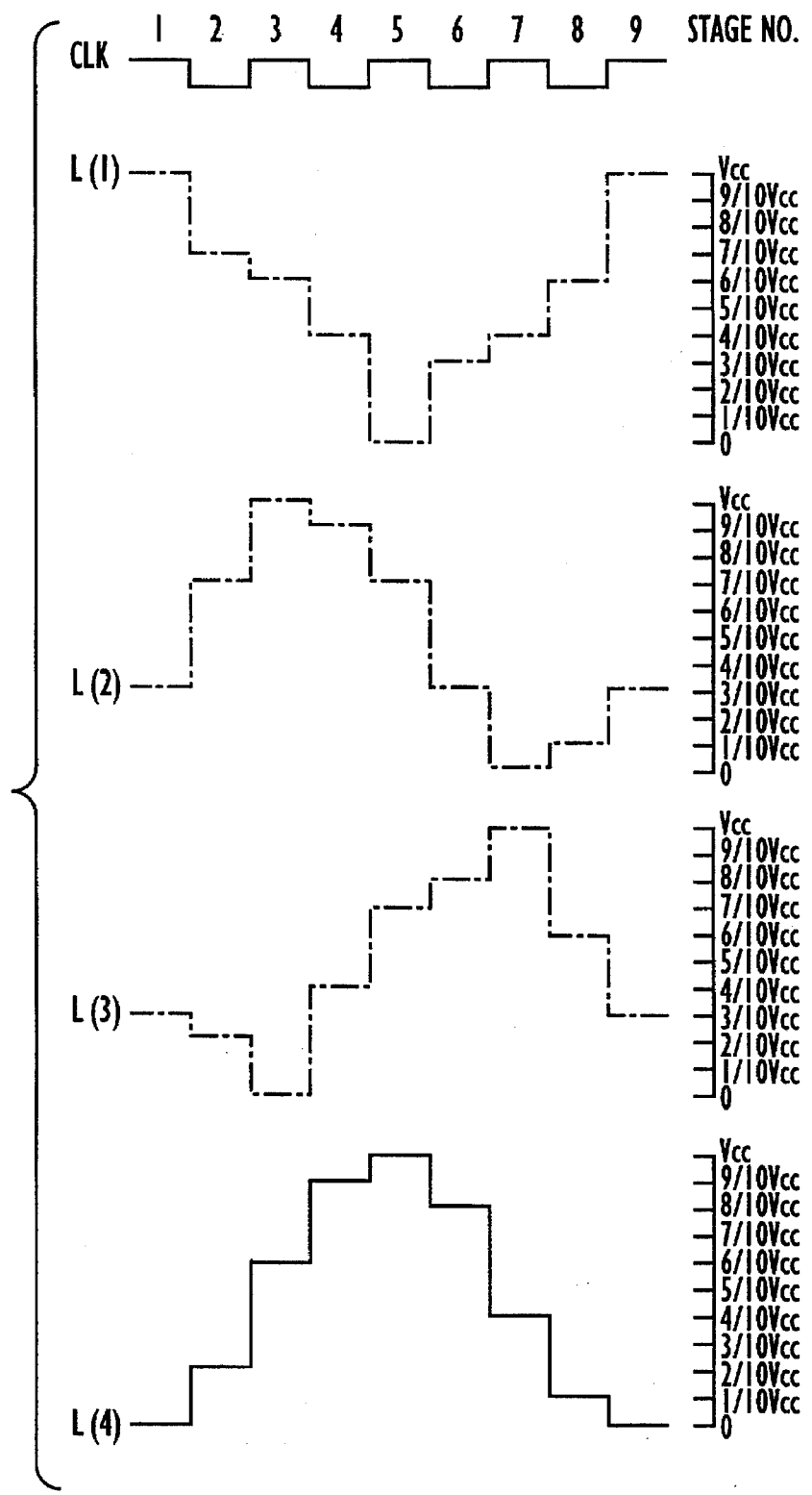
FIG. 7 is a view showing a time chart in the case where four signal lines are provided in a signal transmission circuit of a second embodiment.

FIG. 7 shows variations in the potentials of the signal lines in the case where the number of the signal lines is n=4 and the ratio among the capacitances is $C(1):C(2):C(3):C(4)=1:2:3:4$. If the power-source potential is Vcc, the amount of charge directly consumed by the load capacitances through the power-source line Vcc and ground line Vss during four cycles of the clock CLK is: $C(1)2\cdot Vcc/(C(1)+C(2)+C(3)+C(4))$ for the capacitance $C(1)$; $C(2)2\cdot Vcc/(C(1)+C(2)+C(3)+C(4))$ for the capacitance $C(2)$; $C(3)2\cdot Vcc/(C(1)+C(2)+C(3)+C(4))$ for the capacitance $C(3)$; and $C(4)2\cdot Vcc/(C(1)+C(2)+C(3)+C(4))$ for the capacitance $C(4)$. Since the respective amounts of charge consumed by the capacitances $C(1)$ to $C(4)$ during four cycles of the clock CLK are $C(1)\cdot Vcc$, $C(2)\cdot Vcc$, $C(3)\cdot Vcc$, and $C(4)\cdot Vcc$, the amount of charge supplied from the power source in contrast to the amounts of charge consumed by the capacitances $C(1)$ to $C(4)$ becomes $(C(1)^2+C(2)^2+C(3)^2+C(4)^2)/(C(1)+C(2)+C(3)+C(4))^2$. If the amount of charge supplied from the power source is examined in the case where the capacitances $C(1)$ to $C(4)$ are equal in value, $(C(1)^2+C(1)^2+C(1)^2+C(1)^2)/(C(1)+C(1)+C(1)+C(1))^2=4\cdot C(1)^2/(16\cdot C(1)^2)=¼$ are satisfied.

Although the number n of signal lines is an even number (four) in the above first and second embodiments, the present invention is also applicable to the case where the number n of signal lines is an odd number. For example, if charge redistribution is performed between first and second signal lines in the case where the number n of signal lines is three, the third signal line is connected to one charge accumulating means (e.g., the power-source line Vcc) and the first signal line is connected to the other charge accumulating means (e.g., the ground line Vss) when charge redistribution is subsequently performed between the second and third signal lines, though the drawing thereof is omitted here. Consequently, one signal line that cannot form a pair of signal lines between which charges are redistributed can be alternately connected to the power-source line Vcc and to the ground line Vss in each charge redistributing operation.

Although the foregoing description has assumed the provision of the power-source line Vcc and the ground line Vss so that, when charges are redistributed between two signal lines, one signal line is simultaneously connected to the power-source line Vcc, while the other signal line is connected to the ground line Vss, it is also possible to constitute a signal transmission circuit in which no signal line is connected either to the power-source line Vcc or to the ground line Vss until charge redistribution is repeatedly performed for a specified number of times. In this case, although the potentials of the respective signal lines gradually deviate from expected values due to the leakage of charges in each charge redistribution, the signal line having the highest potential is connected to the power-source line Vcc, while the signal line having the lowest potential is connected to the ground line Vss, at the time at which the influence becomes noticeable (at the completion of the charge redistribution repeatedly performed for a specified number of times).

Third Embodiment

Figure 8:
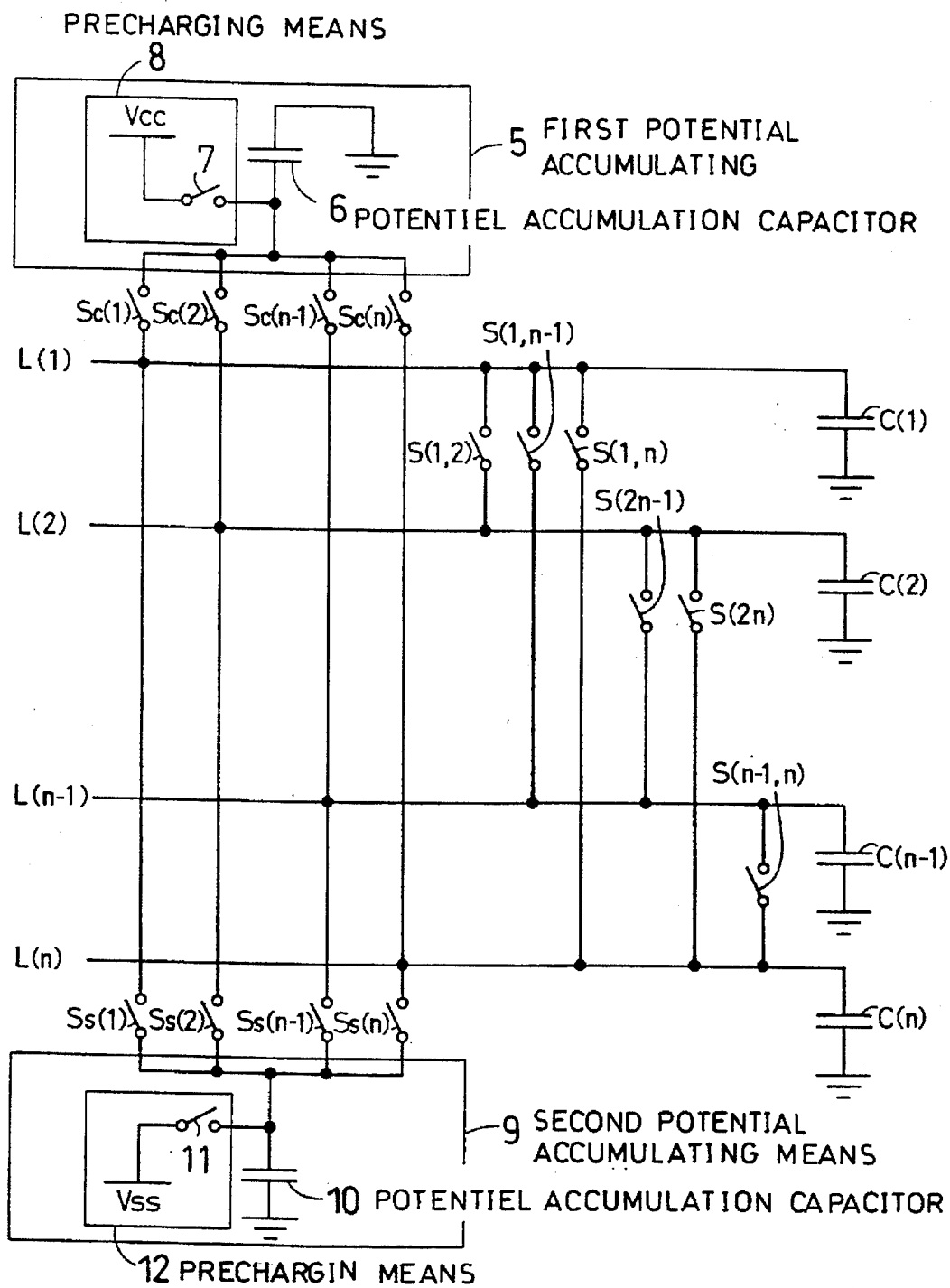
FIG. 8 is a view showing the structure of a principal portion of a signal transmission circuit of a third embodiment.

FIG. 8 shows a signal transmission circuit in a third embodiment of the present invention. In the present embodiment, the first and second potential accumulating means 5 and 9 are composed of: potential accumulation capacitors 6 and 10; and precharging means 8 and 12 provided with switches 7 and 11, respectively, instead of the potential line Vcc and the ground line Vss.

In the case where the power-source line Vcc and the ground line Vss are used as they are as in the above first embodiment, e.g., if the signal transmission circuit is composed of four signal lines having equal load capacitances, the potential of a signal line connected to the power-source line Vcc is ¾·Vcc, so that the power-source line Vcc suffers a localized voltage drop, which incurs noise generation. Even when the potential accumulation capacitor 6 having a sufficiently large capacitance in comparison with the load capacitance of the signal line is used so that the potential accumulation capacitor 6 in which the potential Vcc is accumulated is connected to the signal line having the potential of 3/·Vcc, the potential of the potential accumulation capacitor 6 hardly changes and the potential of the signal line becomes equal to the potential of the potential accumulation capacitor 6.

Consequently, when the potential accumulation capacitors 6 and 10 are precharged in the present embodiment, substantially no potential difference is produced between the power-source potentials (Vcc and Vss) and the potential accumulation capacitors 6 and 10, thereby achieving the effect of generating substantially no noise on the power-source line Vcc and on the ground line Vss.

Since the switches Sc and Ss are only connected every other stage, as described with reference to FIG. 6, the precharging of the potential accumulation capacitors 6 and 10 is performed during the period during which the switches Sc and Ss are not connected.

Fourth Embodiment

Figure 9:
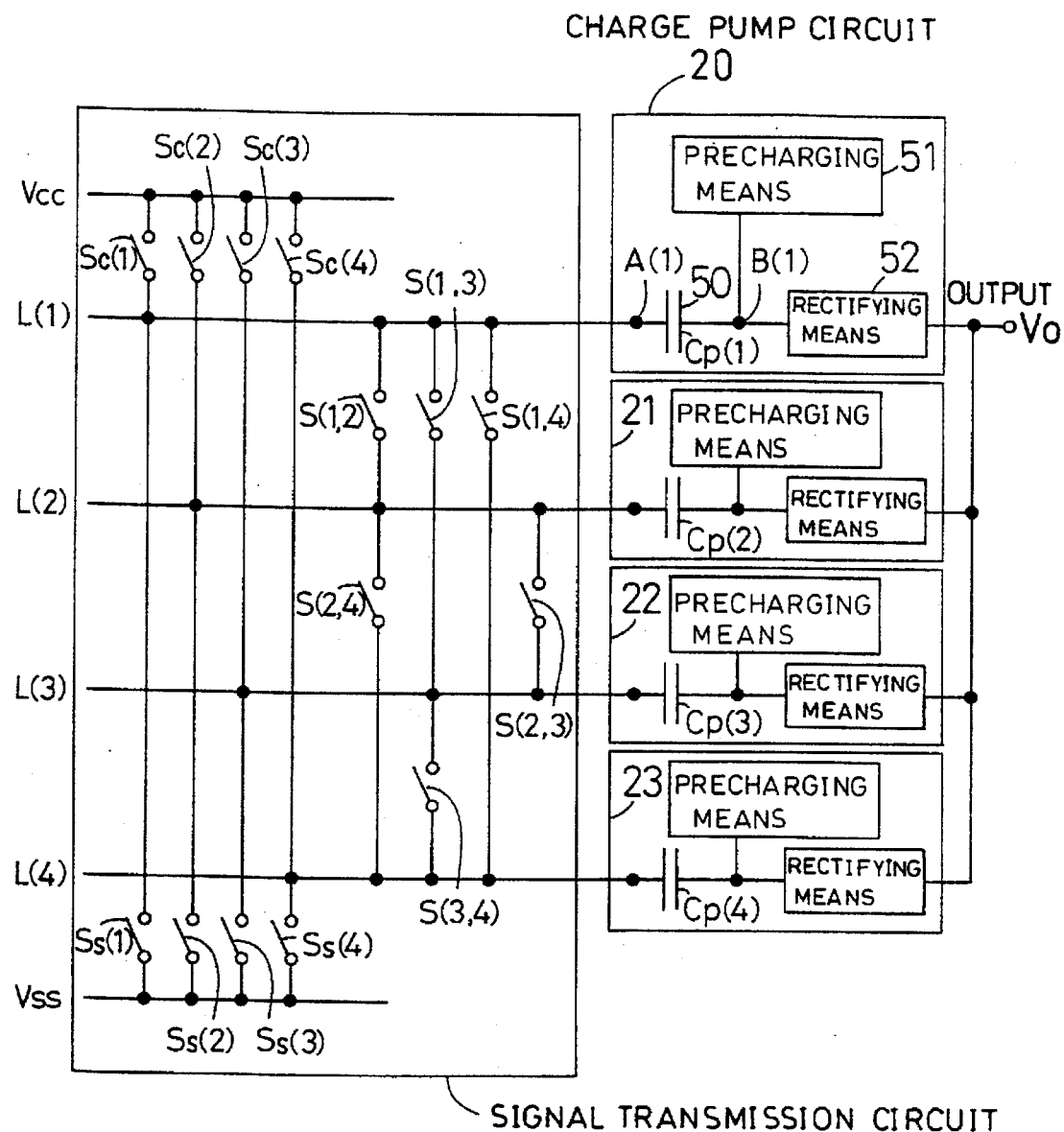
FIG. 9 is a view showing the structure of a principal portion of a power-source voltage generating circuit of a fourth embodiment.

FIG. 9 shows a fourth embodiment of the present invention. In the drawing is shown a power-source voltage generating circuit composed of the signal transmission circuit of the above first embodiment and a plurality of charge pump circuits connected thereto. In FIG. 9, the power-source voltage generating circuit consists of: four charge pump circuits (operating circuits) 20 to 23; and the signal transmission circuit shown in FIG. 1. The signal transmission circuit transmits drive signals for driving the above respective charge pump circuits 20 to 23 along the signal lines L(1) to L(4) to the respective charge pump circuits 20 to 23. In the signal transmission circuit, the drawing of its control circuit is omitted here. Since the above signal transmission circuit has already been described with reference to FIG. 1, the description of its components will be omitted.

Next, a description will be given to the case where an increased-voltage potential is generated using the plurality of charge pump circuits 20 to 23.

The charge pump circuits 20 to 23 have the same structure, so that the description will be given below only to the uppermost charge pump circuit 20 consisting of: a pump capacitor 50(Cp(1)); a precharging means 51; and a rectifying means 52. One electrode of the above pump capacitor 50(Cp(1)) is connected at the node B(1) to the precharging means 51 and to the rectifying means 52. The precharging means 51 has the function of precharging, if the potential of the node B becomes lower than the power-source voltage, the node B so that its potential becomes equal to the power-source voltage. The above rectifying means 52 has the function of supplying, only if the potential of the node B becomes higher than the potential of the output node Vo of the charge pump circuit 20, the charges from the node B to the output node of the charge pump circuit 20 and preventing, if the potential of the node B becomes lower than the potential of the output node of the charge pump circuit 20, a reverse current of the charges from the output node of the charge pump circuit 20 to the node B. The other electrode of the above pump capacitor 50(Cp(1)) is connected at the node A(1) to the corresponding signal line of the signal transmission circuit.

Figure 10A:
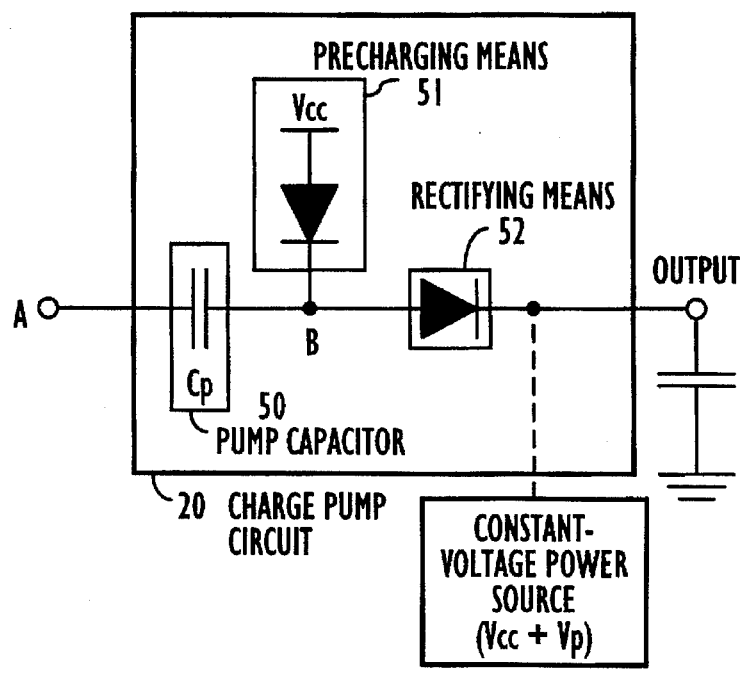
FIG. 10(a) is a view showing the internal structure of a charge pump circuit.
Figure 10B:
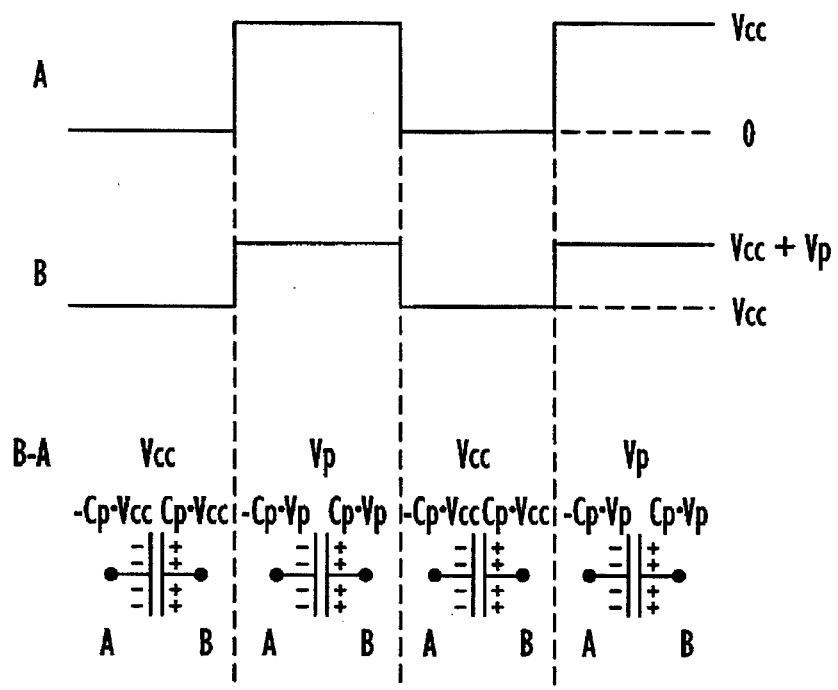
FIG. 10(b) is a view showing a variation in the amount of charge accumulated in the charge pump circuit.

Subsequently, a description will be given to the operation of the charge pump circuit with reference to FIGS. 10. Here, it is assumed that no loss in charge is caused by the precharging means and rectifying means and that the output node is clamped at the potential (Vcc+Vp).

If a rectangular pulse is inputted to the node A so as to drive the charge pump circuit, the potential of the node B varies in synchronization with the potential of the node A. Since the minimum potential of the node B is the power-source voltage Vcc and the maximum potential of the node B is the potential (Vcc+Vp), the potential difference between the nodes A and B becomes the power-source voltage Vcc when the node A is at 0 V, while it becomes Vp when the node A is at the power-source voltage Vcc, as noted in the time chart of FIG. 10(b). The charge appearing at the plate on the side of the node A of the pump capacitor 71(Cp) amounts to −Cp·Vcc when the node A is at 0 V, while it amounts to −Cp·Vp when the node A is at Vcc. The charge appearing at the plate on the side of the node B of the pump capacitor 71(Cp) amounts to Cp·Vcc when the node A is at 0 V, while it amounts to Cp·Vp when the node A is at the power-source voltage Vcc.

Consequently, when the potential of the node A shifts from 0 V to the power-source voltage Vcc, the charge of Cp·(Vcc−Vp) is accumulated in the plate on the side of the node A of the pump capacitor 71(Cp), while the charge of Cp·(Vcc−Vp) is released as an output current from the plate on the side of the node B of the pump capacitor 71(Cp) via the rectifying means 52. On the other hand, when the potential of the node A shifts from the power-source voltage Vcc to 0 V, the charge of Cp·(Vcc−Vp) is released from the plate on the side of the node A of the pump capacitor 71(Cp), while the charge of Cp·(Vcc−Vp) from the power source is accumulated in the plate on the side of the node B of the pump capacitor 71(Cp) by the precharging means 51. In the case of driving the charge pump circuit with a pulse of the amplitude Vcc, the charge of Cp·(Vcc−Vp) is consumed by the charge pump circuit in each cycle from the viewpoint of the node A, so that the charge pump circuit becomes equivalent to a capacitor having the capacitance of Cp·(Vcc−Vp).

Thus, the four charge pump circuits 20 to 23 of FIG. 9 can be considered to be equivalent to capacitors corresponding to the pump capacitors 71(Cp(1) to Cp(4)) and having the respective capacitances of Cp(1)·(Vcc−Vp)/Vcc, Cp(2)·(Vcc−Vp)/Vcc, Cp(3)·(Vcc−Vp)/Vcc, and Cp(4)·(Vcc−Vp)/Vcc.

Accordingly, if the pump capacitors Cp(1) to Cp(4) of FIG. 9 have capacitances equal in value, the charge pump circuits can be driven by consuming ¼ of the amount of charge consumed in driving the four charge pump circuits 20 to 23 independently.

Thus, the amount of charge consumed during one driving cycle by the increased-voltage power-source generating circuit of the present embodiment is the sum of 4·Cp(Vcc−Vp) consumed via the precharging circuit and Cp(Vcc−Vp) consumed for driving the charge pump circuits and the amount of charge outputted is 4·Cp(Vcc−Vp), so that the efficiency becomes 4·Cp(Vcc−Vp)/(4Cp(Vcc−Vp)+(Vcc−Vp))=0.8, i.e., 80%.

Next, a description will be given to the effect of reducing the consumed current in the case of using the increased-voltage power-source generating circuit of the present embodiment.

Figure 11:
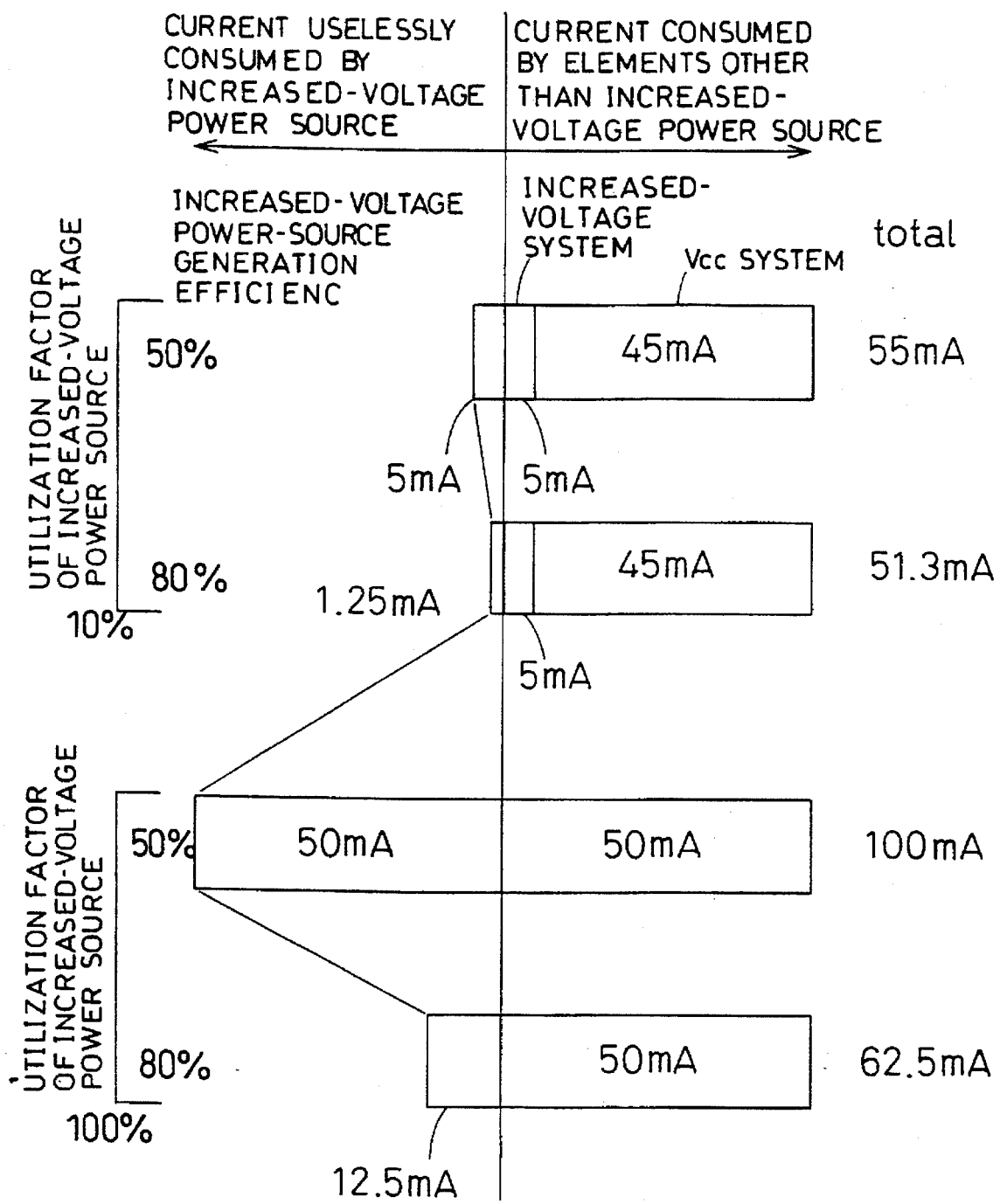
FIG. 11 is a view showing for comparison the current consumed by the present invention and the current consumed by a conventional embodiment in relation to a utilization factor for an increased-voltage power source and to an increased-voltage power-source generation efficiency.

At present, an increased-voltage power source is used only in some circuits, such as a circuit for driving a word line, in a DRAM operated with the power-source voltage of 3.3 V. To reduce the power-source voltage, however, the number of the circuits using the increased-voltage power source should be increased to compensate for a reduction in the driving ability of the MOS transistor, so that all the circuits may use the increased-voltage power source expectedly. FIG. 11 shows, for comparison, the respective consumed currents in the cases where the increased-voltage power-source generation efficiency is 50% and 80% when the utilization factor for increased-voltage power source, which is defined as the rate of the current consumed by an increased-power-source-voltage driven system other than the increased-voltage power-source generating circuit to the total consumed current, is 10% and 100%.

A consideration will be given to the case where, e.g., the utilization factor for the increased-voltage power source is 10% and the current consumed by the power-source-voltage driven system (Vcc system) is 45 mA and the current consumed by the increased-power-source-voltage driven system is 5 mA. If the increased-voltage power-source generation efficiency is 50%, the increased-voltage power-source generating circuit consumes a current of 10 mA in order to supply a current of 5 mA, while a current of 5 mA is uselessly discarded, so that the total consumed current becomes 10 mA. On the other hand, if the increased-voltage power-source generation efficiency is 80%, the increased-voltage power-source generating circuit consumes only 6.25 mA in order to supply a current of 5 mA, while a current of 1.25 mA is uselessly discarded, so that the total consumed current becomes 51.25 mA. Consequently, if the increased-voltage power-source generation efficiency is raised from 50% to 80%, a reduction in consumed current of about 7% is achieved.

On the other hand, if a consideration is given to the case where the utilization factor for the increased-voltage power source becomes 100% as a result of pursuing a further reduction in power-source voltage, e.g., where the current consumed by the power-source-voltage driven system (Vcc system) is 0 mA and the current consumed by the increased-power-source-voltage driven system is 50 mA, the total consumed current becomes 100 mA when the increased-voltage power-source generation efficiency is 50%, since a current of 50 mA is discarded in order to supply a current of 50 mA. When the increased-voltage power-source generation efficiency is 80%, the total consumed current becomes 62.5 mA, since a current of 12.5 mA is discarded in order to supply a current of 50 mA. Consequently, if the increased-voltage power-source generation efficiency is raised from 50% to 80%, a reduction in consumed current of about 37% is achieved.

Although the description has been given to the case where the increased-voltage power source is generated from the power-source voltage generating circuit of FIG. 9, even if the charge pump circuit is constituted so as to generate a reduced-voltage power source, a reduced-voltage power source generating circuit can be implemented without modifying the structure of the signal transmission circuit. Since pump capacitors occupy the largest area in a charge pump circuit, even when the charge pump circuit is divided as in the structure of the present embodiment, an increase in area due to an increase in the area occupied by a control device is small.

In writing data in a flash memory, since a large amount of current from a high-voltage power source of, for example, about 12 V, is consumed, an internal increased-voltage generating circuit is required to operate the flash memory with a single power source. In this case, if the internal increased-voltage generating circuit is composed of the above increased-voltage power-source generating circuit shown in FIG. 9, an increased voltage can be supplied efficiently and stably, as described above. In the increased-voltage power-source generating circuit shown in FIG. 9, since the four charge pump circuits 20 to 23 are driven by the signal transmission circuit of FIG. 9 with their phases shifted from the phases of their respective adjacent circuits by ¼ of one cycle, the increased-voltage power-source generating circuit generates the increased voltage four times during one cycle of driving the charge pump circuit. Compared with a conventional case in which a single internal increased-voltage generating circuit with a large supplying ability is used to generate an increased voltage only once during one cycle of driving the charge pump circuit, the peaks of the increased voltage are observed at four points so that the effect of constantly supplying the increased voltage is achieved.

Fifth Embodiment

Figure 12:
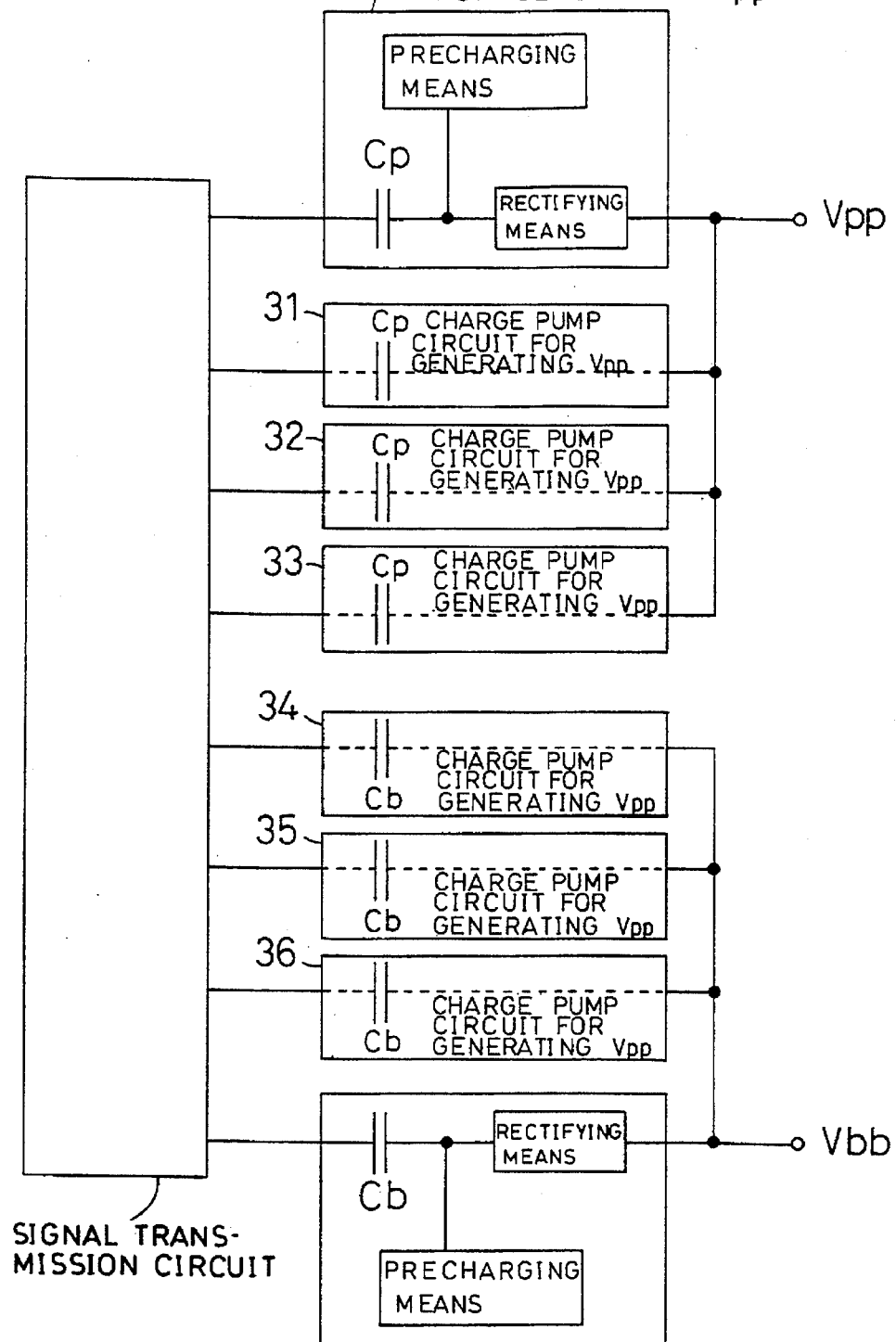
FIG. 12 is a view showing the structure of a principal portion of a power-source voltage generating circuit of a fifth embodiment.

FIG. 12 shows the structure of another power-source voltage generating circuit in a fifth embodiment of the present invention.

In the drawing, the potential of one power-source terminal (output node) Vpp is generated from four charge pump circuits (operating circuits) 30 to 33 for generating a power source Vpp, which are connected in common to the power-source terminal Vpp. The potential of the other power-source terminal (the other output node) Vbb is generated from four charge pump circuits (operating circuits) 34 to 37 for generating a power source Vbb, which are connected in common to the power-source terminal Vbb.

If the current to be supplied from the other power-source terminal Vbb is less than the current to be supplied from the power-source terminal Vpp, the capacitance values of the pump capacitors Cb of the charge pump circuits 34 to 37 for generating the power-source voltage Vbb are set smaller than those of the pump capacitors Cp of the charge pump circuits 30 to 33 for generating the power-source voltage Vpp.

As for the operation of the power-source voltage generating circuit of FIG. 12, it is exactly the same as that of the power-source voltage generating circuit described in the above fourth embodiment, so that the description thereof will be omitted. As described above with reference to FIG. 7, although the load capacitances driven by the signal lines are different in value, the consumed current can be reduced. Although the ability to supply the current from the power-source terminal Vpp is different from the ability to supply the current from the power-source terminal Vbb in the power-source voltage generating circuit, if a plurality of charge pump circuits are connected in common to each of the power-source terminals Vpp and Vbb, a reduction in total consumed current can be achieved.

Sixth Embodiment

Figure 13:
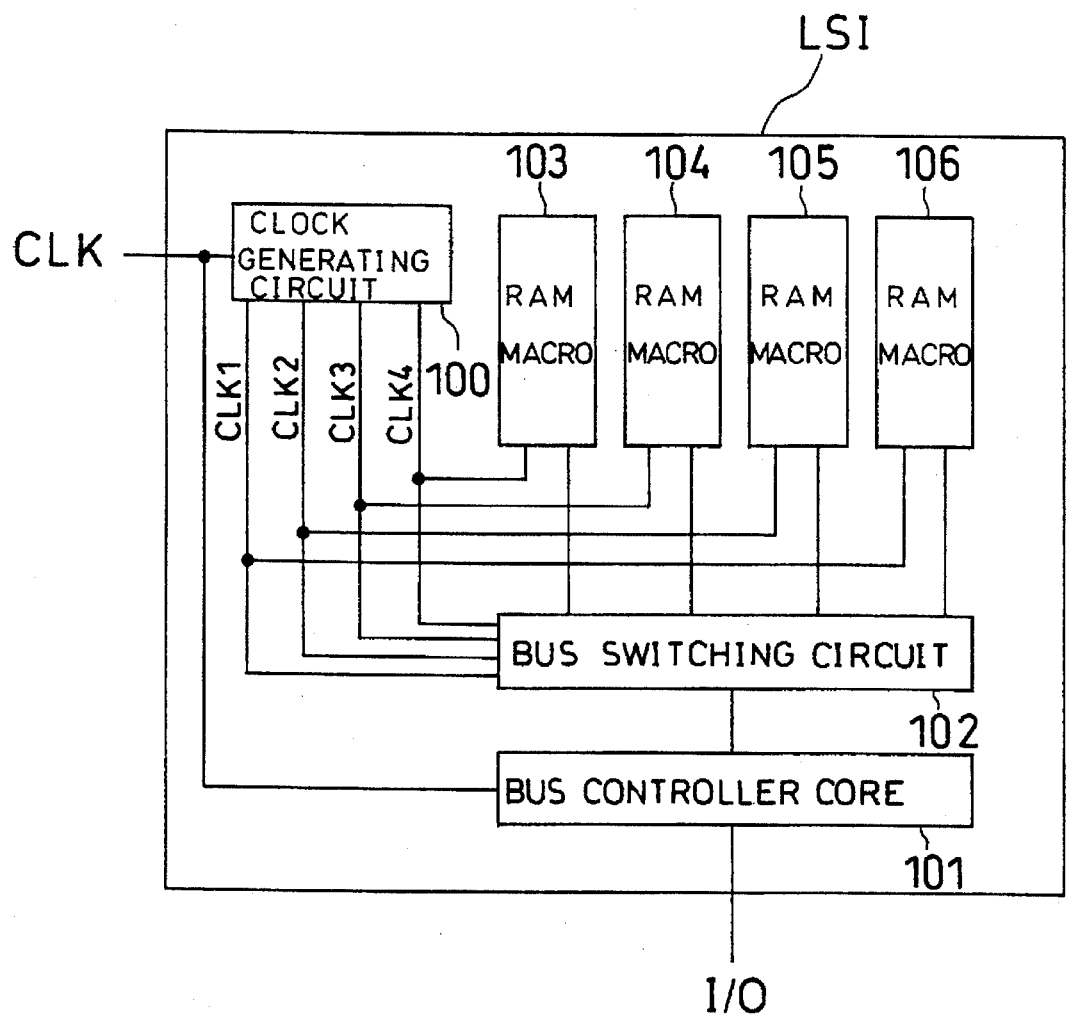
FIG. 13 is a view showing the overall structure of a semiconductor integrated circuit of a sixth embodiment.
Figure 14:
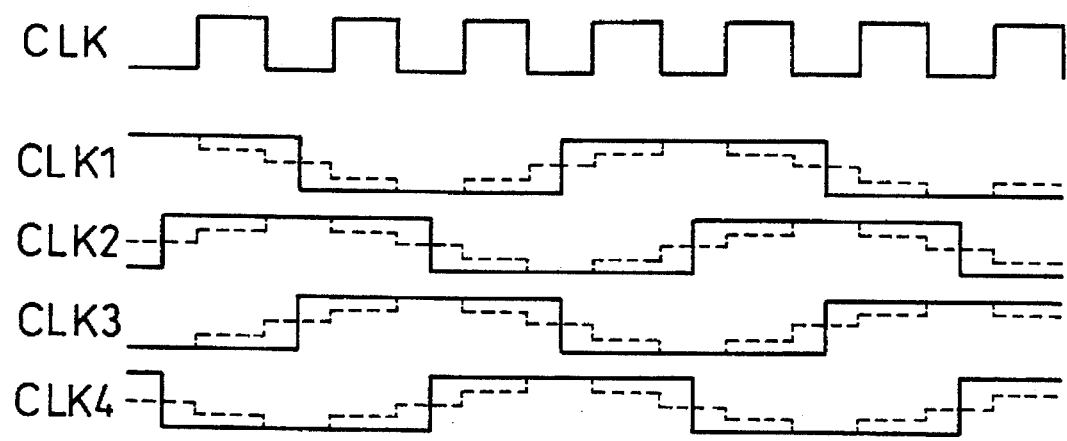
FIG. 14 is a view showing the waveform of an output from a clock generating circuit in a semiconductor integrated circuit of a sixth embodiment.
Figure 15A:
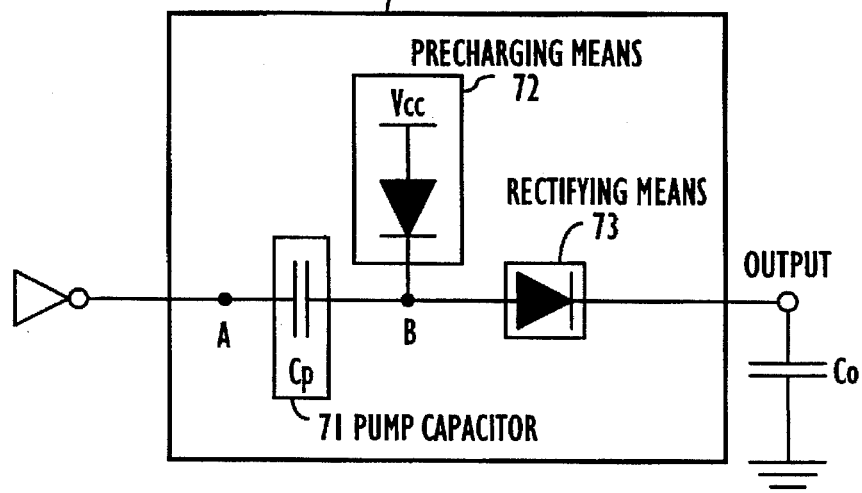
FIG. 15(a) is a view showing a conventional charge pump circuit.
Figure 15B:
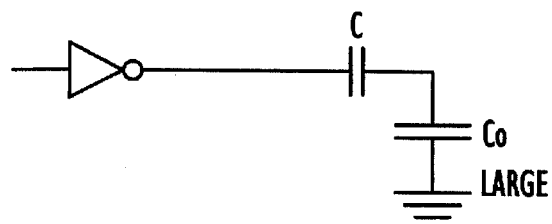
FIG. 15(b) is a view for illustrating the function of the conventional charge pump circuit.
Figure 16:
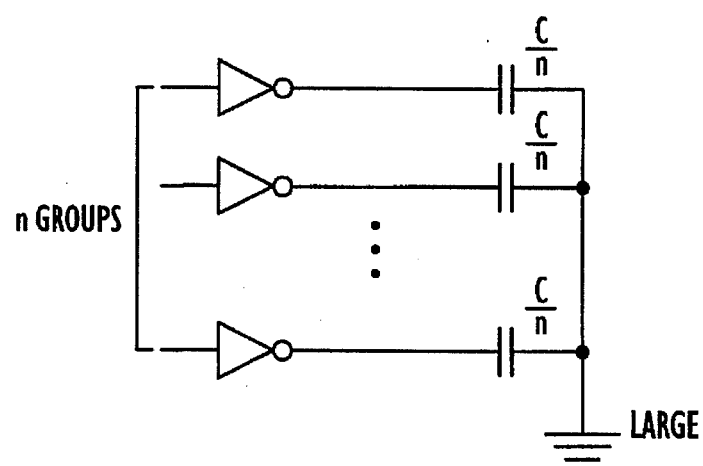
FIG. 16 is a view showing the concept of the present invention.

FIG. 13 shows a sixth embodiment of the present invention. FIG. 13 is a view showing the structure of a large-scale semiconductor integrated circuit LSI which utilizes the above signal transmission circuit of FIG. 1 as a clock generating circuit 100. As shown in FIG. 14, if the signal transmission circuit of the above first embodiment is composed of four signal lines having equal load capacitances, the potentials of the outputs CLK1 to CLK4 from the four signal lines vary in synchronization with the clock CLK as indicated by the broken lines, so that signals (indicated by the solid lines in FIG. 14), each of which is phase shifted from its adjacent signals by ¼ of one cycle and has a cycle four times the cycle of the clock CLK, are generated. Thus, the signal transmission circuit of the first embodiment shown in FIG. 1 also has a frequency dividing function. The clock generating circuit 100 of FIG. 13 has the function of generating the four clock signals CLK1 to CLK4 and also has a function as a transmission circuit for transmitting the clock signals CLK1 to CLK4 along the four signal lines.

The semiconductor integrated circuit LSI of FIG. 13 consists of: a controller core 101; a bus switching circuit 102; and four RAM macros 103 to 106. The above controller core 101 is capable of operating at a high speed on the order of 200 MHz in synchronization with the clock signal CLK inputted from the outside. Each of the RAM macros 103 to 106 operates at a relatively low speed on the order of 50 MHz. The bus switching circuit 102 controls, based on the outputs signals CLK1 to CLK4 from the above clock generating circuit 100, the RAM macros 103 to 106 corresponding to the respective signals CLK1 to CLK4 in parallel, so that the RAM macros 103 to 106 operate in parallel. The above controller core 101, bus switching circuit 102, and RAM macros 103 to 106 constitute an operating circuit.

As a result, data is read from any one of the RAM macros in each cycle of the clock signal CLK, so that it is possible to quadruple the apparent operating speed of the RAM macros.

In the present embodiment, since each of the clock signals CLK1 to CLK4 is phase shifted from its adjacent clock signals by ¼ of one cycle of the clock signal CLK, if the buses between the controller core 101 and the RAM macros 103 to 106 are switched using the bus switching circuit 102 in each cycle of the clock signal CLK, data transmission can be performed in each cycle of the clock signal CLK between the controller 101 and any one of the RAM macros 103 to 106. If the RAM macros 103 to 106 are equal in phase, it becomes necessary to change data transfer rate through parallel-to-serial conversion after temporarily storing data in a buffer or the like. However, the present embodiment is free from such a drawback.

Moreover, since a signal line for the clock signal CLK is generally installed over a long distance on the chip and connected to different functional blocks, the load capacitance of the clock signal line is large so that a large amount of charge is consumed. However, since charges are redistributed among the signal lines for the clock signals CLK1 to CLK4 in the present embodiment, the amount of charge consumed can be reduced, resulting in lower power consumption.

Furthermore, in designing an internal power-source circuit, it is generally required to provide a margin for a peak current, so that the ability of the internal power-source circuit to supply a current should be set higher than the minimum ability of the internal power source to supply a mean consumed current. However, since the present embodiment uses the four clock signals CLK1 to CLK4, each of which is phase shifted from its adjacent clock signals, to control the four RAM macros 103 to 106, the peaks of the currents consumed by the internal power source do not coincide with each other, so that the effect of reducing the current consumed by the internal power-source circuit is also achieved.

If the RAM macros 103 to 106 are to be operated in parallel not for a reduction in consumed current but for higher-speed operation, it is also possible to utilize the plurality of signals generated by the signal transmission circuit of the first embodiment. In this case, only parasitic capacitance, such as wiring capacitance, may be used as the load capacitance or an additional capacitor may be connected. The present embodiment is also applicable not only to the case where the signal transmission circuit is used as an internal circuit in an IC such as LSI, but also to the case where a plurality of chips are collectively controlled, such as in a multi-chip module.

We claim:
1. A signal transmission method
 using a plurality of signal lines, which fall into a first potential state when the potential is in a potential increasing process or into a second potential state different from said first potential state when the potential is in a potential decreasing process, for transmitting a plurality of signals in said first potential state or in said second potential state, comprising the step of:
 redistributing charges between the charges of a signal line having a potential in a potential decreasing process and the charges of a signal line having a potential in a potential increasing process,
 when said plurality of signal lines include a signal line in the potential increasing process and a different signal line in the potential decreasing process,
 whereby said signal line having a potential in the potential increasing process and said different signal line having a potential in the potential decreasing process are made to be in a third potential state between the first potential state and second potential state.
2. A signal transmission method according to claim 1, wherein
 a plurality of pairs of signal lines in potential increasing process and signal lines in potential decreasing process are provided, each pair consisting of one signal line in potential increasing process and one signal line in potential decreasing process, and the operation of redistributing the charges of the signal line in potential decreasing process to said signal line in potential increasing process is simultaneously performed in each of said pairs.

3. A signal transmission method according to claim 1, wherein after redistributing the charges of the signal line in potential decreasing process to the signal line in potential increasing process, the process of redistributing the charges of another signal line in potential decreasing process to said signal line in potential increasing process is repeatedly performed so as to increase stepwise the potential of said signal line in potential increasing process.

4. A signal transmission method according to claim 1, wherein if the potentials of the respective signal lines cyclically vary and each of the variations is phase shifted from its adjacent variations at specified intervals, the charges of the signal line in potential decreasing process are redistributed to said signal line in potential increasing process.

5. A signal transmission method according to claim 1, wherein an even number of signal lines are provided, said even number of signal lines consist of a plurality of signal lines in potential increasing process and a plurality of signal lines in potential decreasing process, said signal lines in potential increasing process and said signal lines in potential decreasing process being equal in number, charges having a first power-source potential are supplied to the signal line having the highest potential of all the signal lines in potential increasing process, while the charges of the signal line having the lowest potential of all the signal lines in potential decreasing process are released to a second power-source potential having a finite difference between said first power-source potential and itself, and simultaneously with said supply and release of the charges, charge redistribution is performed between each of the other signal lines in potential increasing process and the corresponding signal line in potential decreasing process.

6. A signal transmission method according to claim 1, wherein an odd number of signal lines are provided, said odd number of signal lines consist of a plurality of signal lines in potential increasing process and a plurality of signal lines in potential decreasing process, the number of said signal lines in potential increasing process being different by one from the number of said signal lines in potential decreasing process, when the number of said signal lines in potential increasing process is larger by one than the number of said signal lines in potential decreasing process, charges having a first power-source potential are supplied to the signal line having the highest potential of all the signal lines in potential increasing process, while charge redistribution is simultaneously performed between the other signal lines in potential increasing process and said signal lines in potential decreasing process, said other signal lines in potential increasing process and said signal lines in potential decreasing process being equal in number, and when the number of said signal lines in potential increasing process is smaller by one than the number of said signal lines in potential decreasing process, the charges of the signal line having the lowest potential of all the signal lines in potential decreasing process are released to a second power-source potential having a finite difference between said first power-source potential and itself, while charge redistribution is simultaneously performed between said signal lines in potential increasing process and the other signal lines in potential decreasing process, said signal lines in potential increasing process and said other signal lines in potential decreasing process being equal in number.

7. A signal transmission method according to claim 1, wherein charge redistribution is repeatedly performed for a specified number of times between a signal line in potential decreasing process and a signal line In potential increasing process and only thereafter, charges having a first power-source potential are supplied to the signal line having the highest potential of all the signal lines in potential increasing process and the charges of the signal line having the lowest potential of all the signal lines in potential decreasing process are released to a second power-source potential having a finite difference between said first power-source potential and itself.

8. A signal transmission method according to claim 1, wherein the capacitances of the respective signal lines are equal in value.

9. A signal transmission method according to claim 1, wherein the capacitances of the respective signal lines are different from each other in value.

10. A signal transmission circuit comprising:

a plurality of signal lines, which fall into a first potential state when the potential on a signal line is in a potential increasing process or into a second potential state different from said first potential state when the potential on a signal line is a potential decreasing process, for transmitting a plurality of signals in said first potential state or in said second potential state;

a connecting means for connecting said plurality of signal lines to each other; and a control means for connecting, by means of said connecting means, a signal line having an increasing potential of said plurality of signal lines to a signal line having a decreasing potential of said plurality of signal lines so that charges of the signal line having a decreasing potential are redistributed to the signal line having an increasing potential, whereby the potential of said signal line having an increasing potential and said different signal line having a decreasing potential are changed to a third potential state between the first potential state and second potential state.

11. A signal transmission circuit according to claim 10, wherein the control means controls the connecting means so that, in a plurality of pairs of signal lines in potential increasing process and signal lines in potential decreasing process, each pair consisting of one signal line in potential increasing process and one signal line in potential decreasing process, the charges of the signal lines in potential decreasing process are simultaneously redistributed to the corresponding signal lines in potential increasing process.

12. A signal transmission circuit according to claim 10, wherein the control means controls the connecting means so that, after controlling the connecting means so that the charges of the signal line in potential decreasing process are redistributed to the signal line in potential increasing process, the charges of another signal line in potential decreasing process are redistributed to said signal line in potential increasing process.

13. A signal transmission circuit according to claim 10, wherein the control means receives an oscillation signal which cyclically oscillates and controls the connecting means so that two signal lines between which charge redistribution Is performed are newly combined in each specified number of cycles of said oscillation signal.

14. A signal transmission circuit according to claim 10, further comprising:

a first potential accumulating means having a first power-source potential; and a second potential accumulating means having a second power-source potential with a finite difference between said first power-source potential and itself, wherein the connecting means has a power-source connecting means for connecting said plurality of signal lines to said first potential accumulating means and to said second potential accumulating means and the control means controls said power-source connecting means of the connecting means so that the operation of supplying charges having the first power-source potential to the signal line having the highest potential of all the signal lines in potential increasing signal lines and the operation of releasing the charges of the signal line having the lowest potential of all the signal lines in potential decreasing process to the second power-source potential are performed simultaneously or at different times.

15. A signal transmission circuit according to claim 14, wherein the control means receives an oscillation signal which cyclically oscillates and controls the power-source connecting means so that the operation of supplying the charges having the first power-source potential to the signal line having the highest potential of all the signal lines in potential increasing process and the operation of releasing the charges of the signal line having the lowest potential of all the signal lines in potential decreasing process to the second power-source potential are simultaneously performed, said two simultaneous operations being repeatedly performed during the period corresponding to one cycle formed by a plurality of cycles of said oscillation signal.

16. A signal transmission circuit according to claim 10, wherein the connecting means is composed of a CMOS transistor.

17. A signal transmission circuit according to claim 14, wherein the power-source connecting means consists of a first power-source connecting means for connecting each of the signal lines to the first potential accumulating means and a second power-source connecting means for connecting each of the signal lines to the second potential accumulating means and the first power-source connecting means is composed of a PMOS transistor, while the second power-source connecting means is composed of an NMOS transistor.

18. A signal transmission circuit according to claim 14, wherein each of the first potential accumulating means and the second potential accumulating means is composed of a power-source line, said two power-source lines having a finite potential difference therebetween.

19. A signal transmission circuit according to claim 14, wherein each of the first potential accumulating means and the second potential accumulating means is composed of a capacitor and a capacitor precharging means, the precharged levels of said two capacitors having a finite potential difference therebetween.

20. A signal transmission circuit according to claim 19, wherein each of the capacitor precharging means connects the capacitor to a power-source line during some time in each specified number of cycles of the oscillation signal.

21. A semiconductor integrated circuit comprising:

a signal transmission circuit; and operating circuits each for performing a specified operation in response to a signal transmitted from said signal transmission circuit, wherein said signal transmission circuit comprises:

a plurality of signal lines, which fall into a first potential state when the potential on a signal line is in a potential increasing process or into a second potential state different from said first potential state when the potential on a signal line is a potential decreasing process, for transmitting a plurality of signals in said first potential state or in said second potential state;

a connecting means for connecting said plurality of signal lines to each other; and a control means for connecting, by means of said connecting means, a signal line having an increasing potential of said plurality of signal lines to a potential signal source line, whereby said signal line having an increasing potential and said potential signal source line have a finite potential difference therebetween.

22. A semiconductor integrated circuit according to claim 21, wherein the control means controls the connecting means so that, in a plurality of pairs of signal lines in potential increasing process and signal lines in potential decreasing process, each pair consisting of one signal line in potential increasing process and one signal line in potential decreasing process, the charges of the signal lines in potential decreasing process are simultaneously redistributed to the corresponding signal lines in potential increasing process.

23. A semiconductor integrated circuit according to claim 21, wherein the control means controls the connecting means so that, after controlling the connecting means so that the charges of the signal line in potential decreasing process are redistributed to the signal line in potential increasing process, the charges of another signal line in potential decreasing process are redistributed to said signal line in potential increasing process.

24. A semiconductor integrated circuit or a semiconductor integrated circuit according to claim 21, wherein the control means receives an oscillation signal which cyclically oscillates and controls the connecting means so that two signal lines between which charge redistribution is performed are newly combined in each specified number of cycles of said oscillation signal.

25. A semiconductor integrated circuit according to claim 21, further comprising:

a first potential accumulating means having a first power-source potential; and a second potential accumulating means having a second power-source potential with a finite difference between said first power-source potential and itself, wherein the connecting means has a power-source connecting means for connecting said plurality of signal lines to said first potential accumulating means and to said second potential accumulating means and the control means controls said power-source connecting means of the connecting means so that the operation of supplying charges having the first power-source potential to the signal line having the highest potential of all the signal lines in potential increasing signal lines and the operation of releasing the charges of the signal line having the lowest potential of all the signal lines in potential decreasing process to the second power-source potential are performed simultaneously or at different times.

26. A semiconductor integrated circuit according to claim 25, wherein the control means receives an oscillation signal which cyclically oscillates and controls the power-source connecting means so that the operation of supplying the charges having the first power-source potential to the signal line having the highest potential of all the signal lines in potential increasing process and the operation of releasing the charges of the signal line having the lowest potential of all the signal lines in potential decreasing process to the second power-source potential are simultaneously performed, said two simultaneous operations being repeatedly performed during the period corresponding to one cycle formed by a plurality of cycles of said oscillation signal.

27. A semiconductor integrated circuit according to claim 21, wherein the connecting means is composed of a CMOS transistor.

28. A semiconductor integrated circuit according to claim 25, wherein the power-source connecting means consists of a first power-source connecting means for connecting each of the signal lines to the first potential accumulating means and a second power-source connecting means for connecting each of the signal lines to the second potential accumulating means and the first power-source connecting means is composed of a PMOS transistor, while the second power-source connecting means is composed of an NMOS transistor.

29. A semiconductor integrated circuit according to claim 25, wherein each of the first potential accumulating means and the second potential accumulating means is composed of a power-source line, said two power-source lines having a finite potential difference therebetween.

30. A semiconductor integrated circuit according to claim 25, wherein each of the first potential accumulating means and the second potential accumulating means is composed of a capacitor and a capacitor precharging means, the precharged levels of said two capacitors having a finite potential difference therebetween.

31. A semiconductor integrated circuit according to claim 30, wherein each of the capacitor precharging means connects the capacitor to a power-source line during some time in each specified number of cycles of the oscillation signal.

32. A semiconductor integrated circuit according to claim 21, wherein the signal transmission circuit also functions as a signal generating circuit for generating signals to be transmitted along the plurality of signal lines.

33. A semiconductor integrated circuit according to claim 21, wherein the operating circuits are a plurality of charge pump circuits and the plurality of signals transmitted from the signal transmission circuit are drive signals to be supplied to the corresponding charge pump circuits.

34. A semiconductor integrated circuit according to claim 33, wherein each of the charge pump circuits comprises:

a pump capacitor to which any one of the signals transmitted from the signal transmission circuit is inputted;

a rectifying means connected to said pump capacitor; and a precharging means for supplying charges to a connecting point between said pump capacitor and said rectifying means.

35. A semiconductor integrated circuit according to claim 34, wherein the respective rectifying means are connected in common to one output node.

36. A semiconductor integrated circuit according to claim 34, wherein some of all the rectifying means are connected in common to one output node and the other rectifying means are connected in common to another output node.

37. A semiconductor integrated circuit according to claim 34, wherein the capacitance values of all the pump capacitors are substantially equal to each other.

38. A semiconductor integrated circuit according to claim 34, wherein the capacitances values of all the pump capacitors are different from each other.

39. A semiconductor integrated circuit according to claim 21, wherein the plurality of signals transmitted from the signal transmission circuit are clock signals to be supplied to the corresponding operating circuits.

40. A semiconductor integrated circuit according to claim 39, wherein the operating circuits operate in parallel.

* * * * *